United States Patent
Ragupathi et al.

(10) Patent No.: US 10,481,655 B2
(45) Date of Patent: Nov. 19, 2019

(54) SYSTEMS AND METHODS FOR DYNAMIC AND ADAPTIVE COOLING FAN SHADOWING IN INFORMATION HANDLING SYSTEMS

(71) Applicants: Dinesh Kunnathur Ragupathi, Round Rock, TX (US); Carlos G. Henry, Round Rock, TX (US); Eric M. Tunks, Austin, TX (US)

(72) Inventors: Dinesh Kunnathur Ragupathi, Round Rock, TX (US); Carlos G. Henry, Round Rock, TX (US); Eric M. Tunks, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 633 days.

(21) Appl. No.: 14/880,749

(22) Filed: Oct. 12, 2015

(65) Prior Publication Data

US 2017/0102747 A1    Apr. 13, 2017

(51) Int. Cl.
*G06F 1/20* (2006.01)
*H05K 7/20* (2006.01)
*G05B 13/02* (2006.01)

(52) U.S. Cl.
CPC ......... *G06F 1/206* (2013.01); *G05B 13/0215* (2013.01); *H05K 7/20736* (2013.01); *H05K 7/20836* (2013.01); *Y02D 10/16* (2018.01)

(58) Field of Classification Search
CPC ............. G06F 1/206; H05K 7/20; H05K 7/20136–20209; H05K 7/20536–20863; H05K 7/20909; H05K 7/20972; G06N 99/002; G05B 13/0265–048

USPC .................................................. 700/275, 300
See application file for complete search history.

(56) References Cited

U.S. PATENT DOCUMENTS

| | | | |
|---|---|---|---|
| 7,194,337 B2* | 3/2007 | Sharma | G05D 23/1931 156/200 |
| 7,310,738 B2* | 12/2007 | Bhagwath | G05D 23/1917 713/300 |
| 7,742,844 B2 | 6/2010 | Coxe, III | |
| 8,156,358 B2 | 4/2012 | Brumley et al. | |
| 8,560,132 B2* | 10/2013 | Matteson | H05K 7/20836 165/287 |
| 8,788,111 B2* | 7/2014 | Uhlmann | G06F 1/206 700/299 |
| 9,820,409 B1* | 11/2017 | Ross | H05K 7/20718 |
| 2005/0096789 A1* | 5/2005 | Sharma | G05D 23/1931 700/245 |

(Continued)

OTHER PUBLICATIONS

Lovicott et al., "Systems and Methods of Adaptive Thermal Control for Information Handling Systems", U.S. Appl. No. 14/664,317, filed Mar. 20, 2015, 56 pgs.

*Primary Examiner* — Todd Aguilera
(74) *Attorney, Agent, or Firm* — Egan Peterman Enders Huston

(57) ABSTRACT

Systems and methods of controlling the fan speed of one or more secondary variable speed cooling fans of an information handling system in real time by dynamically and adaptively shadowing the fan speed of another primary variable speed cooling fan or by so shadowing the fan speed of the variable cooling fan/s of a primary cooling fan zone including other variable speed primary cooling fans of the same information handling system.

20 Claims, 14 Drawing Sheets

(56) References Cited

U.S. PATENT DOCUMENTS

| | | | |
|---|---|---|---|
| 2006/0178786 A1* | 8/2006 | Bhagwath | G05D 23/1917 700/300 |
| 2006/0190532 A1 | 8/2006 | Chadalavada | |
| 2006/0212143 A1 | 9/2006 | Nguyen et al. | |
| 2008/0306633 A1 | 12/2008 | Tunks et al. | |
| 2012/0010754 A1* | 1/2012 | Matteson | H05K 7/20836 700/282 |
| 2012/0224322 A1 | 9/2012 | Artman et al. | |
| 2013/0054047 A1* | 2/2013 | Uhlmann | G06F 1/206 700/300 |
| 2013/0176680 A1 | 7/2013 | Lovicott et al. | |
| 2014/0032011 A1 | 1/2014 | Artman et al. | |
| 2014/0208136 A1 | 7/2014 | Rahardjo et al. | |
| 2015/0039871 A1 | 2/2015 | Shetty et al. | |
| 2015/0271010 A1 | 9/2015 | Shetty et al. | |

\* cited by examiner

| | | | | | | | Dynamic Shadowing: Uniform control | | | | | | | SweetSpot | | | |
|---|---|---|---|---|---|---|---|---|---|---|---|---|---|---|---|---|---|
| | | Test Description | Shadow 100 | Shadow 95 | Baseline | Shadow 85 | Shadow 80 | Shadow 75 | Shadow 70 | Shadow 65 | Shadow 60 | Shadow 55 | Shadow 50 | Shadow 45 | Shadow 40 | Shadow 35 |
| | | CPU Target | 75-77 | 75-77 | 75-77 | 75-77 | 75-77 | 75-77 | 75-77 | 75-77 | 75-77 | 75-77 | 75-77 | 75-77 | 75-77 | 75-77 |
| Fan Shadow | | Fan 1 | | | | | | | | | | | | | | |
| | | Fan 2 | 100% | 95% | 90% | 85% | 80% | 75% | 70% | 65% | 60% | 55% | 50% | 45% | 40% | 35% |
| | | Fan 3 | X | X | X | X | X | X | X | X | X | X | X | X | X | X |
| | | Fan 4 | 100% | 95% | 90% | 85% | 80% | 75% | 70% | 65% | 60% | 55% | 50% | 45% | 40% | 35% |
| | | Fan 5 | | | | | | | | | | | | | | |
| | | Fan 6 | | | | | | | | | | | | | | |
| | | Data File | | | | | | | | | | | | | | |
| PSU 1 Power | | Watts | 177.5 | 177.3 | 178.3 | 178.3 | 177.5 | 177.3 | 176.5 | 176.3 | 175.8 | 175.3 | 174.8 | 174.8 | 175.0 | 174.5 |
| PSU 2 Power | | Watts | 137.8 | 137.8 | 137.8 | 138.0 | 137.3 | 137.0 | 136.5 | 136.0 | | | 134.8 | | 135.0 | 134.8 |
| Fan Power | | Watts | 13.8 | 13.7 | 13.2 | 12.3 | 11.8 | 11.3 | 10.3 | 9.8 | 9.1 | 9.1 | 8.7 | 8.7 | 8.9 | 9.4 |
| CPU 1 | | degC | 78.0 | 78.0 | 77.0 | 76.0 | 75.0 | 75.0 | 75.0 | 75.0 | 75.0 | 76.0 | 76.0 | 77.0 | 77.0 | 77.0 |
| CPU 2 | | degC | 0.0 | 0.0 | 0.0 | 0.0 | 0.0 | 0.0 | 0.0 | 0.0 | 0.0 | 0.0 | 0.0 | 0.0 | 0.0 | 0.0 |
| Fan 1 | | %PWM | 28 | 22 | 23 | 21 | 18 | 17 | 17 | 17 | 17 | 18 | 18 | 18 | 18 | 18 |
| Fan 2 | | %PWM | 55 | 50 | 53 | 50 | 47 | 44 | 41 | 38 | 35 | 32 | 29 | 26 | 26 | 24 |
| Fan 3 | | %PWM | 55 | 52 | 60 | 60 | 60 | 60 | 60 | 60 | 60 | 60 | 60 | 60 | 60 | 61 |
| Fan 4 | | %PWM | 55 | 50 | 53 | 50 | 47 | 44 | 41 | 38 | 35 | 32 | 29 | 26 | 26 | 26 |
| Fan 5 | | %PWM | 40 | 36 | 38 | 36 | 34 | 32 | 29 | 27 | 25 | 23 | 20 | 20 | 20 | 20 |
| Fan 6 | | %PWM | 28 | 25 | 27 | 26 | 24 | 23 | 20 | 20 | 17 | 18 | 18 | 18 | 18 | 18 |
| Fan PWM Avg | | %PWM | 44 | 39 | 42 | 41 | 38 | 37 | 35 | 33 | 32 | 31 | 29 | 28 | 28 | 28 |
| Total Fan Power (PCF) | | Watts | 13.8 | 13.7 | 13.2 | 12.3 | 11.8 | 11.3 | 10.3 | 9.8 | 9.1 | 9.1 | 8.7 | 8.7 | 8.9 | 9.4 |
| Total System Power (PSYS) | | Watts | 315 | 315 | 316 | 316 | 315 | 314 | 313 | 312 | 311 | 311 | 310 | 309 | 310 | 309 |
| PTCR | | Power To Cool Ratio | 4.36% | 4.34% | 4.18% | 3.87% | 3.73% | 3.59% | 3.30% | 3.15% | 2.93% | 2.94% | 2.79% | 2.80% | 2.85% | 3.04% |

FIG. 14

SYSTEMS AND METHODS FOR DYNAMIC AND ADAPTIVE COOLING FAN SHADOWING IN INFORMATION HANDLING SYSTEMS

FIELD OF THE INVENTION

This invention relates generally to information handling systems and, more particularly, to cooling for information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

One or more cooling fans are typically employed within the electronic chassis enclosure of information handling system platforms, such as servers, to cool components operating within the information handling system chassis. Such cooling fans may be uncontrolled, i.e., running at full power whenever the information handling system is a powered on state. However, cooling fans consume power, create noise, and create airflow, each of which becomes of greater concern in a data center where a plurality of information handling system platforms may be operating, e.g., as servers. Cooling fans may also be controlled based on ambient temperature within an information handling system chassis enclosure.

As thermal control of electronic enclosures has evolved it has become common for discrete mapping of thermal sensors directly to a cooling fan zone defined within an enclosure. This allows for localized component cooling requirements to be directly coupled to discrete fan/s, minimizing system acoustic and fan power compared to having a single system fan zone. By mapping component cooling requirements to a fan zone instead of to all system fans, cooling fan power savings greater than 25% can be achieved. However, there are disadvantages associated with mapping a component to a single fan zone. For example, when a component is directly mapped to a single fan zone, thermal requirements for the component can only be affected by increasing cooling fan speeds for this single zone. This limits local airflow potential and can lead to higher fan power for component cooling.

It is known to employ a flexible weighted mapping of component cooling requirements to cooling fan zones, with weighted mapping of fan zones to each other. Fan mapping between fan zones can be a percentage, an offset, or a combination of the two. For example, a known equation for pulse width modulation (PWM) cooling fan mapping used in a thermal control algorithm is given below:

Fan Zone Mapping: PWM_Config(PWM(zone)) $=a*\text{PWM(zone)}+c$

By applying weighted fan zone mapping, cooling can be optimized for power consumption as function of component thermal requirements by reducing maximum fan speeds. Since fan power is a cubic of fan speed, decreasing maximum fan speeds can reduce system fan power even if other adjacent fan speeds are increasing.

For modular information handling systems, each module may have a pre-defined set of fans in a given fan zone that are the primary assigned fans for the given module. Remaining (secondary) fans in the modular chassis can be controlled based on the speed of the fans in the given fan zone. In this regard, the secondary fans within a modular chassis enclosure may be set to a speed that is a fixed function of the current speed of the primary cooling fans of the given module fan zone. One such conventional fan mapping approach controls secondary fan speed using a hard-coded or static fixed percentage value that is taken from a thermal table and which is obtained by thermal characterization run mainly for worst-case system thermal configurations. Using this approach, the fan speed of the secondary fans are controlled to be a fixed percentage of the fan speed of the primary fans in the given module fan zone. For example, secondary fan speed may be controlled to always be a fixed percentage of the current fan speed of the primary cooling fans within the given module fan zone. In another conventional "all or nothing" approach, secondary fan speed may be switched back and forth between a fixed percentage of the current primary fan speed of the given module fan zone, and an independent fan speed that is not dependent or based on the current fan speed of the primary cooling fans within the given module fan zone.

Controlling secondary fan speed to be a static fixed percentage of the current speed of the primary cooling fans of a given module fan zone is a conventional "one size fits all" approach that does not account for component variation or for different steady state conditions. In this regard, the static percentage value may prove sub-optimal from a power savings perspective for configurations other than the ones tested during system development. In addition, it is difficult to tune the static percentage value during thermal development due to huge number of different configurations & factors. Further, there is a thermal risk of airflow recirculation if the static fixed percentage values are incorrectly chosen to be too low.

Another conventional methodology implemented in blade server enclosures begins by not controlling any secondary fan speed based on the current speed of a primary cooling fan. If the chassis management controller (CMC) of the blade server enclosure detects a blade fan speed request of 100% for longer than a set time period, it quickly ramps up secondary fans to 100% to provide additional airflow. This solution is prone to fan speed oscillation.

SUMMARY OF THE INVENTION

Disclosed herein are systems and methods of controlling the fan speed of one or more secondary variable speed_ cooling fans of an information handling system in real time by dynamically and adaptively shadowing the fan speed of another primary variable speed cooling fan or by so shadowing the fan speed of the variable cooling fan/s of a primary cooling fan zone including other variable speed primary cooling fans of the same information handling system. In this regard, the term "fan shadowing" is used herein to describe the case where the current real time fan speed of one or more given variable speed cooling fans are set to a speed that is a function (e.g., percentage or ratio) of the current real time fan speed of another variable speed cooling fan or of the fan speed of a cooling fan zone that does not include the given cooling fan/s. In one embodiment, the disclosed systems and methods may be so implemented to use real time and dynamic fan shadowing adjustment to adapt a variety of different actual information handling system operating conditions and/or information handling system user scenarios. In one embodiment, the disclosed systems and methods may be implemented to utilize a designated processing device (e.g., an out-of-band processing device) of an information handling system to dynamically determine and optimize a fan shadowing value based on real time configuration and load conditions in a manner to minimize cooling fan power consumption relative to overall system power consumption, such as to increase cooling power efficiency (and/or decrease system power consumption) by minimizing the power-to-cool ratio (PTCR) of an information handling system without sacrificing information handling system performance.

In one exemplary embodiment, the designated processing device may be configured to monitor real time operating power load and/or operating temperature of one or more given system driving components (e.g., such as system host CPU, GPU, power supply, etc.) that is mapped to the cooling fan/s of a given cooling fan zone. The designated processing device may be further configured to optionally first wait for a system steady state operating condition to be reached by the given driving component/s prior to beginning dynamic adaptive cooling fan shadowing operation. Such a system steady state operating condition may be identified based on determined steady state condition of one or more operating parameters (e.g., such as operating power load and/or operating temperature conditions). For example, such a system component steady state operating temperature and/or load may be identified based on monitored historical operating parameter data (e.g., temperature data, fan speed data, power consumption data, combinations thereof, etc.) for the given system component/s. Once the designated processing device determines that the given system component/s have reached a steady state condition, the designated processing device may be configured to store the steady state parameters as a starting point for further reference.

Whether or not a steady state operating condition is first identified, a designated processing device of the information handling system may also be configured in one embodiment to initially determine the main driving fan or fans mapped to a given driving component/s of a given cooling fan zone, as well as one or more assigned shadowing fan/s for the given cooling fan zone, and a corresponding initial shadowing relationship (e.g., initial percentage shadowing value) for the assigned shadowing fans, such as may be stored and retrieved from a thermal table in coupled memory or which may be determined in any other suitable manner (e.g., such as randomly assigned at each startup, determined from previous stored operating parameter data, etc.).

In another exemplary embodiment, a designated processing device of an information handling system may be configured to implement a multi-level shadowing algorithm to find an optimal shadowing point (OSP) for one or more shadowing fan/s within an information handling system chassis enclosure that are configured to shadow the main driving fan/s of a given cooling fan zone (e.g., such as a group of multiple cooling fans that are assigned to shadow a main driving fan of a given cooling fan zone). The particular identity of such shadowing fan/s assigned to a given cooling fan zone may be previously determined as described above, or may be known by or accessible to the designated processing device in any other suitable manner, e.g., via storage in non-volatile memory. For example, a first level of a shadowing algorithm may be implemented by the designated processing device to determine an optimal shadowing relationship adjustment direction (e.g., up or down by an incremental fixed percentage value of $X_1$%) which the speed of the shadowing fans/s speed should be adjusted to get an optimal cooling fan power efficiency benefit, such as an optimal (e.g., minimized) power-to-cool ratio (PTCR). For example, an initial shadowing relationship value (e.g., such as shadowing percentage value) may be adjusted by a number "N" of incremental stepped steps in at least one direction UP (e.g., increased "$X_1$" percentage value from initial shadowing percentage value) and/or DOWN (e.g., decreased "$X_1$" percentage value from initial shadowing percentage value) to determine which of the two directions achieves a greater cooling power efficiency benefit, such as achieving a lower PTCR value.

After the first level, a multi-level shadowing algorithm may be further implemented by performing at least one additional second level uniform shadowing method to determine a second level OSP which may be, for example, a given shadowing percentage value that is determined using a uniform shadowing adjustment methodology. The uniform shadowing adjustment methodology may be accomplished by adjusting all shadowing fan/s of a given group of shadowing cooling fans in the same optimal shadowing relationship adjustment direction (i.e., up or down) previously determined in the first level method, e.g., by incrementally adjusting the shadowing percentage value in the direction found in level 1 by an incremental fixed value (e.g., by a fixed percentage value of $X_2$%) on all shadowing fans of the given group of shadowing cooling fans at the same time, and repeating this adjustment until a group OSP is achieved when the minimum power to cool PTCR is found while at the same time keeping all the other system components in the information handling system chassis enclosure (i.e., other than the system driving component/s mapped to the cooling fan/s of the given cooling fan zone) within the thermal specification.

Once a second level OSP is determined for a given group of shadowing fans as described above, an optional third level non-uniform shadowing method may be further performed on individual shadowing fans of the given group of shadowing fans to determine individual OSP values for individual fans of the given group of multiple shadowing fans. During this third level third level non-uniform shadowing method, the designated processing device may iteratively adjust (e.g., by an incremental fixed percentage value of $X_3$%) each individual shadowing fan of the given shadowing group one at a time. This third level methodology may be repeated for each of the other shadowing fans of the given group of shadowing fans to determine an OSP and corresponding cooling fan power efficiency for each individual shadowing fan, after which cooling fan power efficiency of the respective OSP's determined for all shadowing cooling fans of the group may be compared. The best OSP result (e.g., corresponding to best cooling fan power efficiency such as lowest PTCR value) may be chosen from this comparison and then selected or "frozen" as the operational OSP, e.g., and stored in non-volatile memory that is accessible the designated processing device or other processing device/s that control cooling fan speed. It will be understood that OSP may vary across different system component configurations and/or system power loads. Thus, in one embodiment the designated processing device may iteratively and continuously repeat the steps of the multi-level shadowing algorithm at all times while the information handling system is operating such that OSP values are continuously adapted to all the real time system configuration and/or load changes to provide maximum cooling fan power efficiency, e.g., by minimizing PTCR.

In one respect, disclosed herein is an information handling system, including: a chassis enclosure; at least one heat-producing component contained within the chassis enclosure; at least one temperature sensor configured to sense and provide a heat-producing component temperature signal representing the real time sensed temperature of the heat-producing component; at least two separate variable speed cooling fans configured to provide different flow rates of cooling air within the chassis enclosure, at least one of the variable speed cooling fans being mapped as a primary cooling fan to cool the at least one heat-producing component and at least one of the variable speed cooling fans being a secondary cooling fan assigned to shadow the real time fan speed of the primary cooling fan; and at least one processing device that is coupled to receive the heat-producing component temperature signal from the temperature sensor, the processing device being configured to control a real time fan speed of the primary cooling fan based on the heat-producing component temperature signal to cool the heat-producing component. The at least one processing device may be further configured to: control a real time fan speed of the secondary cooling fan relative to the real time controlled fan speed of the primary cooling fan based on a shadowing relationship, vary a value of the shadowing relationship so as to control the real time fan speed of the secondary cooling fan relative to the varied real time controlled fan speed and determine at least two values of cooling power efficiency associated with at least two respective different shadowing relationship values, then select a value of the shadowing relationship from the at least two different shadowing relationship values that corresponds to a greater cooling power efficiency between the two different shadowing relationship values, and then control the real time fan speed of the secondary cooling fan relative to the real time controlled fan speed of the primary cooling fan based on the selected shadowing relationship value that corresponds to a greater cooling power efficiency.

In another respect, disclosed herein is a method for controlling cooling fan response within a chassis enclosure of an information handling system, including: operating at least one heat-producing component contained within the chassis enclosure, and using at least one temperature sensor to sense and provide a heat-producing component temperature signal representing the real time sensed temperature of the heat-producing component; operating at least two separate variable speed cooling fans to provide different flow rates of cooling air within the chassis enclosure, at least one of the variable speed cooling fans being mapped as a primary cooling fan to cool the at least one heat-producing component and at least one of the variable speed cooling fans being a secondary cooling fan assigned to shadow the real time fan speed of the primary cooling fan; and using at least one processing device to receive the heat-producing component temperature signal from the temperature sensor, and using the processing device to control a real time fan speed of the primary cooling fan based on the heat-producing component temperature signal to cool the heat-producing component. The method may further include using at least one processing device to: control a real time fan speed of the secondary cooling fan relative to the real time controlled fan speed of the primary cooling fan based on a shadowing relationship, vary a value of the shadowing relationship so as to control the real time fan speed of the secondary cooling fan relative to the varied real time controlled fan speed and determine at least two values of cooling power efficiency associated with at least two respective different shadowing relationship values, then select a value of the shadowing relationship from the at least two different shadowing relationship values that corresponds to a greater cooling power efficiency between the two different shadowing relationship values, and then control the real time fan speed of the secondary cooling fan relative to the real time controlled fan speed of the primary cooling fan based on the selected shadowing relationship value that corresponds to a greater cooling power efficiency.

BRIEF DESCRIPTION OF THE DRAWINGS

FIG. 14 illustrates data collected and employed according to one exemplary embodiment of the disclosed systems and methods.

DESCRIPTION OF ILLUSTRATIVE EMBODIMENTS

Figure 1:
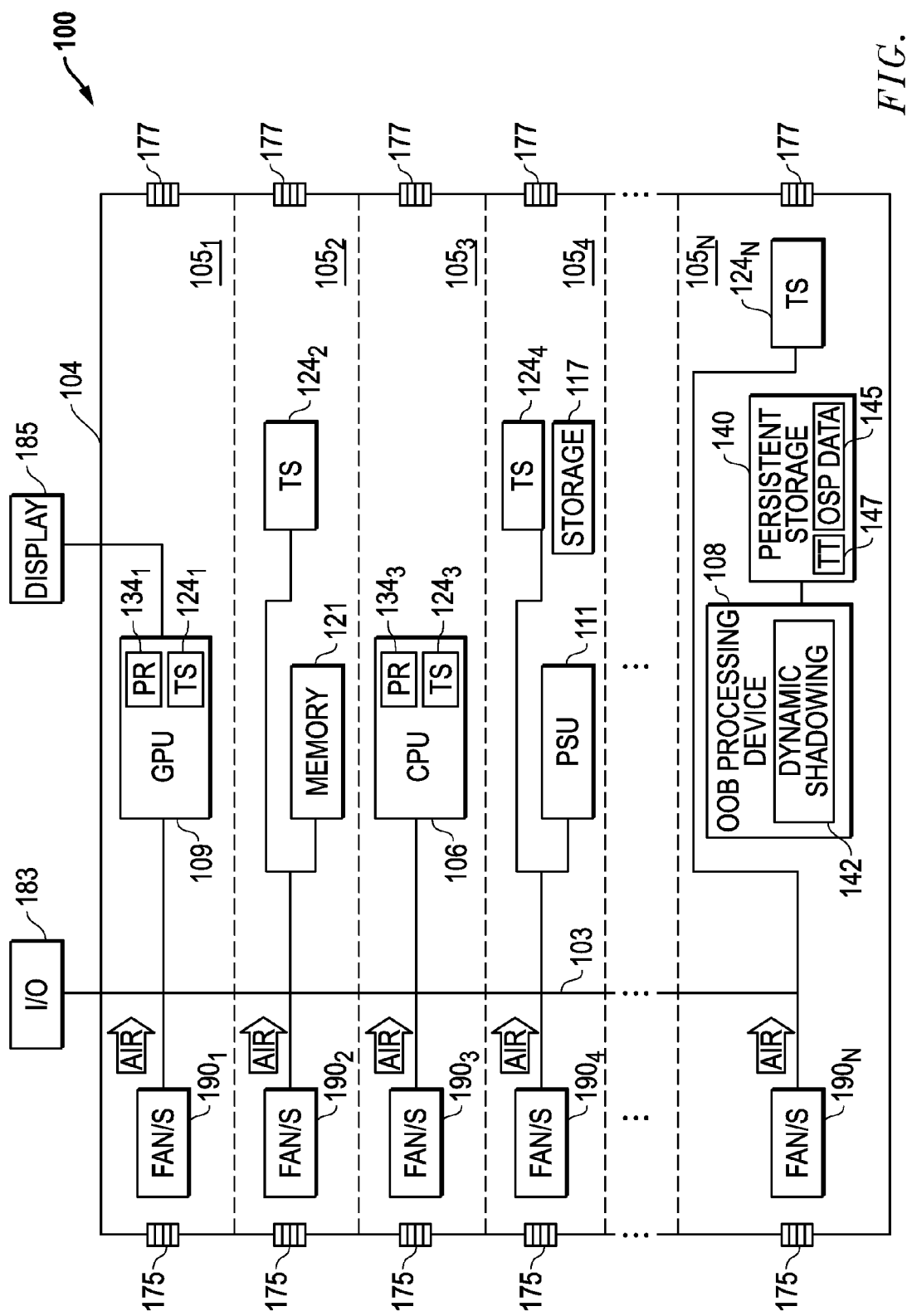
FIG. 1 illustrates an information handling system platform according to one exemplary embodiment of the disclosed systems and methods.

FIG. 1 illustrates one exemplary embodiment of an information handling system platform 100 configured in this embodiment as a server platform, although the disclosed systems and methods may be implemented with other types of information handling system configurations such as desktop or tower computer configurations, workstation configurations, notebook computer configurations, etc. As shown, system platform 100 includes individual and discrete heat-producing electrical components (e.g., components 109, 121, 106, 108, 111, 117 140, etc.) and multiple variable speed cooling fans $190_1$ to $190_N$ that are configured to cool the respective heat-producing components. Examples of heat-producing components illustrated in the embodiment of FIG. 1 include one or more in-band host processing devices 106 (e.g., a CPU executing host operating system), video/graphics hardware (e.g., discrete graphics processing unit or video card/s) 109, memory (e.g., RAM) 121, system power supply PSU 111, storage 117 (e.g., one or more HDDs), persistent or non-volatile storage 140, and out-of-band processing device 108 (e.g., baseboard management controller "BMC", service processor, embedded processor, remote access controller, etc.).

At least one PSU 111 supplies power to all power-consuming components of system 100, which includes the heat producing electrical components and cooling fans 190 of system 100. It will be understood that other types and combinations of heat-producing components are possible, e.g., a given system 100 may be provided with two or more PSU's 111 for supplying all the power-consuming components of system 100 and/or two or more CPUs 106. In one embodiment, out-of-band processing device 108 may be coupled and configured to monitor and/or control (and thus be aware of) total power provided by the one or more PSUs 111 to power all the power-consuming components of system 100, and may also be coupled and configured to monitor and/or control (and thus be aware of) real time power consumption by individual power-consuming components (e.g., such as individual cooling fans 190). In this regard, processing device 108 may be configured to directly monitor power consumption of an individual power-consuming component and/or may be configured to receive reported component power consumption from another intervening component (e.g., chassis power manager) of system 100, e.g., such as described in U.S. Pat. No. 8,156,358 which is incorporated herein by reference in its entirety for all purposes.

As used herein, an out-of-band processing device is separate and independent from any in-band host central processing unit (CPU) that runs the host OS of the information handling system, and without management of any application executing with a host OS on the host CPU. Examples of other types of additional components not shown but that may be present in the embodiment of FIG. 1 include, but are not limited to, input/output (I/O) circuitry, network adapters, RAID controller, etc. In the illustrated embodiment, an optional external video display (e.g., LED or LCD display) 185 and optional external input/output devices (e.g., mouse, QWERTY keyboard, touchpad, etc.) 183 are also illustrated present for allowing local user interaction and configuration of system 100, it being understood that network connections may also or alternatively be present for allowing interaction and configuration by a remote user.

In this embodiment, each of the individual heat-producing components are contained within an enclosure 104 (e.g., such as a 2 U, 3 U, 4 U computer chassis, tower or desktop computer chassis, etc.) and is mapped to be a driving component of a respective cooling fan zone 105 within which the individual heat-producing component is primarily cooled by corresponding primary cooling fan/s 190 of the same cooling fan zone 105 as illustrated by the arrows that show direction of cooling air flow. For example discrete graphics processing unit (GPU) 109 is mapped as a driving component for cooling fan zone $105_1$ which includes corresponding cooling fan/s $190_1$ that is assigned as primary cooling fan/s for cooling components within fan zone $105_1$, central processing unit (CPU) 106 is mapped as a driving component for cooling fan zone $105_3$ which includes corresponding cooling fan/s $190_3$ that is assigned as primary cooling fan/s for cooling components within fan zone $105_3$, etc. It will be understood that there is open space that allows air flow around one or more sides of each of individual heat-producing components, and across the dashed borders between the adjacent cooling fan zones 105. Moreover, it will be understood that it is possible in one embodiment that one or more fan zones 105 of an information handling system 100 may not include a heat-producing component.

In one embodiment, each cooling fan 109 produces an airflow pattern in the direction of the arrow and that is primarily contained within a particular three-dimensional cross-sectional volume within and between the top and bottom sides of chassis enclosure 104. In one embodiment, each given one of cooling fan zones 105 includes a at least one respective corresponding cooling fan 109 that is operable to produce a flow of cooling air within the given cooling fan zone 105. In FIG. 1, each cooling fan 190 has been assigned a respective zone 105 delineated by non-physical dashed lines in FIG. 1 that at least partially overlaps the airflow pattern produced by its corresponding assigned fan 190 such that during system operation of all cooling fans each given zone 105 contains more air flow generated by its corresponding assigned fan 190 than it contains from any other cooling fan 190 of the system, and such that the majority of the cooling airflow generated by a given fan flows through and is contained within its assigned corresponding cooling fan zone 105. However, it will be understood that some air flow generated from a cooling fan 190 of an adjacent cooling fan zones 105 may cross the dashed lines into one or more adjacent cooling fan zones 105 to which it is not assigned.

Thus, although a particular cooling fan/s 190 may be assigned as primary cooling fan/s for a given cooling fan zone 105 and its corresponding heat-producing component/s, it will be understood that adjacent secondary cooling fans 190 not within the given cooling fan zone 105 itself may also affect cooling of the component/s within the given cooling fan zone 105 itself due to airflow crossing or bleeding over into adjacent cooling fan zones 105. As a result these other secondary cooling fans 190 also affect the cooling of individual heat-producing components of the information handling system 100 and therefore overall system cooling efficiency and power-to-cool ratio (PTCR). Thus, the disclosed systems and methods may be implemented to utilize cooling fan zone shadowing to optimize cooling efficiency and power-to-cool ratio (PTCR) of the information handling system 100.

Additional numbers and/or other types of heat-producing components (such as previously described) may also be contained within enclosure 104 and mapped as driving components for respective cooling fan zones 105 that include respective cooling fan/s 190. In this regard, it is possible that multiple primary driving components (e.g., such as multiple CPUs) may be present within a given primary cooling fan zone 105 that are together used to drive one or more primary cooling fan/s 190 mapped to the multiple CPUs 105 within the primary cooling fan zone 105 in order to cool both CPUs, e.g., sensed temperature reported from the two CPUs may be averaged and used to control the cooling fan speed of the primary cooling fan/s 105, maximum value of the two sensed temperatures reported by the two respective CPUs used to control the cooling fan speed of the primary cooling fan/s 105, etc.

In the illustrated embodiment of FIG. 1, temperature sensor/s 124 may be present to sense and report component operating temperature and/or circulating air temperature within each fan zone 105. It will be understood that one or more of temperature sensor/s 124 (e.g., temperature sensors $124_1$ and $124_3$ of FIG. 1) may be integrated within each of the heat-producing components such that each heat-producing component may report its internal operating temperature. As shown, one or more data buses or other suitable communication media path 103 may also be provided for allowing communication of data (e.g., sensed temperature data, component operational power draw data, fan speed data, digital fan speed control signals) between the various components of system platform 100. Further examples of types and configurations of heat-producing components, temperature sensor, and cooling fan configurations with which the disclosed systems and methods may be implemented may be found, for example, in United States Patent Application Publication Number 2014/0032011; United States Patent Application Publication Number 2013/0176680; United States Patent Application Publication Number 2012/0224322; and in U.S. patent application Ser. No. 14/664,317 filed Mar. 20, 2015; each of which is incorporated herein by reference in its entirety for all purposes.

In the illustrated embodiment, exemplary inlet vents 175 and outlet vents 177 are shown defined in the enclosure wall of chassis enclosure 104. Inlet vents 175 are provided to allow fan/s 190 to draw ambient cooling air into chassis enclosure 104 from the atmosphere surrounding outside chassis enclosure 104 so that it may be circulated by fan/s 190 across the heat-producing components within the enclosure 104. Outlet vents 177 are provided to allow this air that has been heated by transfer of heat from the heat-producing components fan/s 190 to be exhausted back to the outside atmosphere around enclosure 104. It will be understood that the illustrated number and configuration of vents 175 and 177 (and their relationship to fan/s 190 and fan zones 105) is exemplary only, and that any other number and/or configuration of inlet and outlet vents is possible that is suitable for allowing circulation of cooling air across the heat-producing component/s of each cooling fan zone 105, and that each fan zone 105 does not need to include either one of vents 175 or 177.

Still referring to FIG. 1, out-of-band processing device 108 may in one embodiment be designated and configured to control speed of cooling fans 190 based on sensed temperature received from temperature sensors 124 in order to dynamically and adaptively shadow the fan speed of one or more primary cooling fans 190 of a given cooling fan zone 105 with one or more secondary cooling fan/s 190 that are not of the given cooling fan zone 105. As such, out-of-band processing device 108 is also aware of the real time current fan speed and power consumption of each of controlled cooling fans 190. However, it will be understood that in other embodiments, any other type of processing device may be alternatively designated and configured to control speed of cooling fans 190. In one embodiment, out-of-band processing device 108 of FIG. 1 may be a service processor configured as a remote access controller that is coupled to persistent storage 140, e.g., non-volatile memory. Such a remote access controller may be an integrated Dell Remote Access Controller (iDRAC) available from Dell Products L.P. of Round Rock, Tex. Further information on such a remote access controller may be found in United States Patent Publication No. 2006/0212143 and United States Patent Publication No. 2006/0190532, each of which is incorporated herein by reference in its entirety for all purposes. However, it will be understood that other configurations of remote access controllers and other types of out-of-band processing devices may be suitably employed in other embodiments as a processing device that is designated for controlling speed of cooling fans 190 based on sensed temperature from temperature sensors 124.

As previously described, one or more heat-producing components of information handling system platform 100 may be provided with a respective integral or discrete thermal sensing circuitry or sensor/s 124 (e.g., CPU internal digital temperature sensor such as Intel DTS) that is configured to sense the real time temperature of its corresponding hardware component and then to report this sensed temperature digitally to out-of-band processing device 108 across communication media path 103, e.g., at predetermined time intervals that may be unique for each component. One or more of the heat-producing components of information handling system platform 100 may also be configured with power and/or current sensing and reporting logic 134 (e.g., CPU load current monitor such as IMON) to report real time current or power consumption of its corresponding hardware component digitally to out-of-band processing device 108 across communication media path 103. Non-volatile persistent storage 140 may also contain stored thermal control parameters 147 and dynamic shadowing logic that are accessible by out-of-band processing device 108. As described further herein, out-of-band processing device 108 may execute dynamic shadowing logic 142 to control operation of cooling fan/s 190 based at least in part on OSP data 145 and other thermal control parameters (e.g., such may be stored in thermal table/s 147) retrieved from persistent storage 140 as well as measured temperature information received from sensors 124 and component power consumption information from one or more system heat-producing components that is received across communication media path 103.

As an example, out-of-band processing device 108 may be configured in one example embodiment to implement dynamic shadowing control 142 (e.g., including a multi-level shadowing algorithm to find an OSP) to adaptively control a shadowing relationship between secondary cooling fans $190_2$ and $190_4$ that are assigned to shadow a primary cooling fan $190_3$ of cooling fan zone $105_3$ based on real time CPU current or power consumption information received from power reporting logic $134_3$ of CPU 106 across communication media path 103 and based on real time measured CPU component temperature data obtained from integral temperature sensor $124_3$ across communication media path 103. In this regard, out-of-band processing device 108 may provide control data or signals to each of fan/s 190 to implement the methodology described herein, and may store OSP information 145 on persistent storage 140 together with any other information or data that may be utilized to implement dynamic shadowing control 142.

It will be understood that system platform 100 illustrated in FIG. 1 is exemplary only, and that the disclosed systems and methods for dynamic cooling fan shadowing may be implemented with any other information handling system embodiments that include different numbers (more or less) of heat-producing electrical components, cooling fans 190, and/or cooling fan zone/s 105. Further, although one particular exemplary embodiment of an out-of-band processing device 108 is illustrated in FIG. 1, the disclosed systems and methods may be implemented in other embodiments using any other type and/or combination of out-of-band processing devices and/or in-band processing devices (e.g., such as host processing device 106) that is suitable for implementing one or more features of the disclosed systems and methods as described herein. It will also be understood that an out-of-band processing device is a processing device separate and independent from any in-band host central processing unit (CPU) such as host processing device 106 that runs the host OS of an information handling system platform 100, and without management of any application executing with a host OS on the host processing device 106.

For purposes of illustration herein, the disclosed dynamic cooling fan shadowing systems and methods will be described in part with reference to the exemplary embodiment of FIG. 1 as it may be implemented to use secondary cooling fans $190_2$ and $190_4$ of cooling fan zones $105_2$ and $105_4$ to dynamically shadow primary cooling fan $190_3$ of cooling fan zone 105 in order to cool CPU 106 of cooling fan zone $105_3$. However, it will be understood that the disclosed systems and methods may utilize any other combination or number of secondary cooling fans 190 and/or zones 105 to dynamically shadow any other given one of primarily cooling fans 190 or cooling fan zones 105 of FIG. 1.

Figure 2:
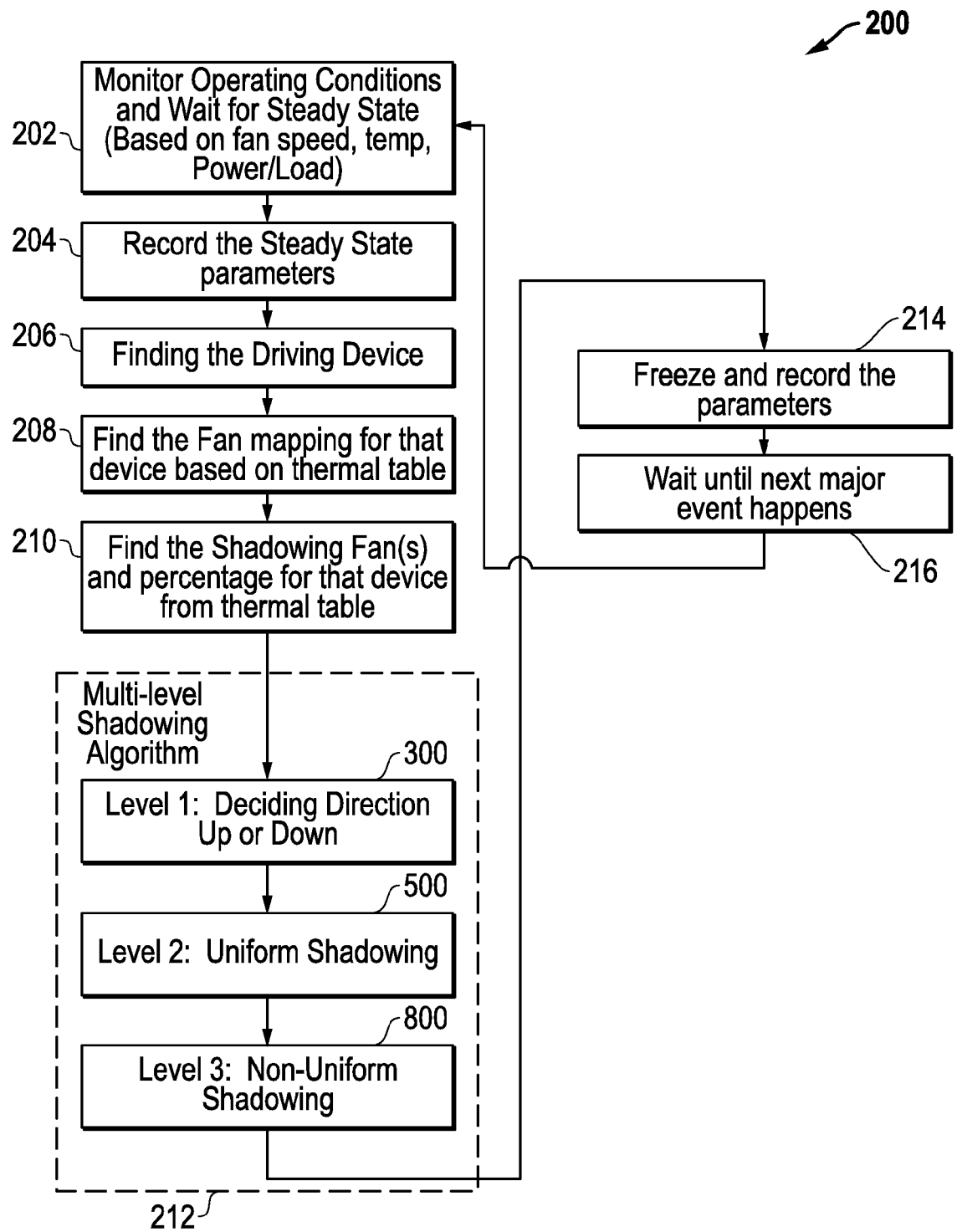
FIG. 2 illustrates methodology according to one exemplary embodiment of the disclosed systems and methods.

FIG. 2 illustrates one exemplary of methodology 200 that may be performed (e.g., by an out-of-band processing device 108) to implement real time optimal fan shadowing of one or more primary cooling fan/s 190 of a given cooling fan zone 105 of an information handling system that is mapped to a selected given driving device, such as cooling fan $190_3$ of cooling fan zone $105_3$ of FIG. 1. Methodology 200 may begin automatically upon power-on and system booting of information handling system 100 to determine OSP for the shadowing secondary cooling fans 190 and/or shadowing secondary cooling fan zones 105. In one embodiment, methodology 200 may be performed again after system power-on and booting upon detection of the occurrence of a major event that significantly effects the cooling power efficiency (and/or steady state operation) as described further herein.

As shown methodology 200 begins while processing device 108 is monitoring real time system operating parameter conditions (e.g., real time cooling fan speeds, real time component (e.g., CPU) temperatures, real time component (e.g., CPU) power consumption, real time component (e.g., CPU) current consumption, real time component (e.g., CPU) power consumption determined from real time component current information, etc.). In step 202 methodology 200 optionally waits for steady state system operating parameter conditions to be established before proceeding to subsequent steps. In the case of exemplary system embodiment of FIG. 1, processing device 108 may wait until monitored historical operating parameter data (e.g., temperature data, fan speed data, power consumption data, current consumption data, combinations thereof, etc.) reaches steady state. Once the designated processing device determines that the given system component/s have reached a steady state condition, the designated processing device may be configured to record and store (e.g., as part of OSP data in persistent storage 145) the determined steady state parameters in step 204 as a starting point for further reference.

In one embodiment, such a steady state condition may be identified by processing device 108, for example, based on at least one of the following conditions of Table 1 being satisfied:

TABLE 1

| Condition I.D. | Parameter | Condition/s to Be Satisfied for Steady State |
| --- | --- | --- |
| A | Cooling fan speed change request received from heat-producing component by designated processing device | No cooling fan speed change request received within the last X seconds |
| B | Actual cooling fan speed change made | No actual cooling fan speed change occurred within the last Y seconds |
| C | Component temperature change reported by heat-producing components | No reported heat-producing component temperature change occurred within the last Z seconds |

In the embodiment of Table 1, each of the values of X, Y and Z may be different from each of the other values, or may be the same as one or more of the other values. Further each of the values of X, Y and Z may be selected to be any suitable predefined value selected as a pre-condition for establishing a steady state condition. In one embodiment, each of the values of X, Y and Z may be independently set to be a value of from about 30 seconds to about 90 seconds, alternatively from about 45 seconds to about 75 seconds, and further alternatively about 60 seconds. However, it will be understood that any one or more of the values of X, Y and Z may be less than 30 seconds or greater than 90 seconds. Moreover, any one or more of the different conditions A, B and C may be selected in a given embodiment for use in establishing occurrence of steady state condition, e.g., only condition A need be satisfied in one embodiment, conditions A and B need to be satisfied in another embodiment, conditions B and C need to be satisfied in another embodiment, all conditions A, B and C need to be satisfied in another embodiment, etc. In a further embodiment, establishment of a steady state condition may not only require one or more of conditions of Table 1 be satisfied, but may also optionally further require that all heat-producing components be currently operating within their respective predefined operating specifications (e.g., each heat-producing component must be operating within its acceptable predefined operating temperature range).

Once it is determined that steady state conditions are achieved, methodology 200 proceeds to step 206 where a given driving device for one or more cooling fans 190 is selected or otherwise identified, e.g., by retrieving this information from a thermal table 147 stored in persistent storage 140. Then in step 208, the fan mapping is determined for a selected given driving device of step 206. For example, a thermal table 147 may contain information mapping CPU 106 as the driving device for primary cooling fan $190_3$ of cooling fan zone $105_3$, i.e., this zone mapping assigns speed of primary cooling fan $190_3$ of cooling fan zone $105_3$ to be controlled by out-of-band processing device 108 based on real time sensed temperature of CPU 106 using thermal table data that specifies a relationship between sensed temperature of CPU 106 and cooling fan speed. It will be understood that where an information handling system has multiple drive devices for different primary cooling fan zones 105, methodology 200 may be performed separately by a processing device such as out-of-band processing device 108 for each different driving device, e.g., sequentially or simultaneously. It will also be understood that in one embodiment where multiple driving devices are present, each shadowing secondary cooling fan 190 and/or shadowing secondary cooling fan zone 105 will only be assigned to a single driving device.

In one example, thermal table data 147 may optionally specify default fan speed RPM (e.g., as pulse width modulation values) for a primary cooling fan of an information handling system platform at a given sensed temperature (or alternatively at a given range of sensed temperature). Such specified fan speed (e.g., RPM) values and baseline temperature response of such a thermal table may be pre-defined based on thermal engineering and default thermal loadings for different system components, and may be selected to help ensure sufficient cooling of the components of a given default system configuration that includes a specific default number and type/s of system components. As the sensed operating temperature increases or decreases, the fan speed of the mapped primary variable speed cooling fan/s 190 is automatically increased or decreased (e.g., via pulsed width modulation "PWM" control signals) according to a relationship (e.g., pre-defined linear (X-Y) or polynomial relationship, etc.) of the thermal table that specifies increasing fan speed with increasing temperature. Additional information and other suitable types of fan control information that may be stored in a thermal table 147 or otherwise utilized as a starting point for fan speed in step 208 may be found, for example, described in United States Patent Application Publication Number 2014/0032011; and in U.S. patent application Ser. No. 14/664,317 filed Mar. 20, 2015; each of which is incorporated herein by reference in its entirety for all purposes.

Next in step 210, the identity of the shadowing secondary variable speed cooling fans (e.g., cooling fans $190_2$ and $190_4$ of respective cooling fan zones $105_2$ and $105_4$) assigned to the mapped primary cooling fan (e.g., cooling fan $190_3$) of steps 206 and 208, e.g., by accessing this information from thermal table 147. In one embodiment, relationship between driving device, mapped primary cooling fan, and shadowing secondary cooling fan/s may be specified by a user, e.g., entered by user via GUI display 185 and I/O 183. Table 1 illustrates a simple example in which a selected given driving device CPU 106 is mapped to primary cooling fan zone 3 ($105_3$) for CPU 106 and in which another driving device GPU 109 is mapped to primary cooling fan zone 1 ($105_1$) for GPU 109. Table 1 also specifies secondary cooling fan zones 2 and 4 as each being assigned an initial or predefined shadow point relationship (coefficient a=0.9 or 90%) relative to primary cooling fan zone 3, although the same shadowing point value does not need to be assigned to each of cooling fan zones 2 and 4 in other embodiments. In the example of Table 1, no shadowing secondary zones are shown assigned to cooling fan zone 1 that is mapped to GPU 109. In one embodiment, the shadow point coefficient or percentage for secondary cooling fan/s may be applied to the control signal (e.g., PWM control signal) used to control a primary cooling fan to produce the control signal for the secondary cooling fans, e.g., primary cooling fan $190_3$ of this example may be controlled with a 100% PWM control signal from processing device 108, while secondary cooling fans are controlled using 90% of the same PWM control signal.

TABLE 2

| Driving Device | CPU | | | | | | GPU | | | | | |
|---|---|---|---|---|---|---|---|---|---|---|---|---|
| Cooling Fan Zones | 1 | 2 | 3 | 4 | 5 | 6 | 1 | 2 | 3 | 4 | 5 | 6 |
| Primary Zone Mapped to Driving Device | | | X | | | | X | | | | | |
| Initial Shadowing Coefficients by Cooling Fan Zone | a | b | c | d | e | f | a | b | c | d | e | f |
| Zone 1 Secondary Shadowing Coefficients | | | | | | | | | | | | |
| Zone 2 Secondary Shadowing Coefficients | | | 0.9 | | | | | | | | | |
| Zone 3 Secondary Shadowing Coefficients | | | | | | | | | | | | |
| Zone 4 Secondary Shadowing Coefficients | | | 0.9 | | | | | | | | | |
| Zone 5 Secondary Shadowing Coefficients | | | | | | | | | | | | |
| Zone 6 Secondary Shadowing Coefficients | | | | | | | | | | | | |

Next, methodology 200 proceeds to multi-level shadowing algorithm 212 that in this embodiment includes three levels: direction decision level 300, uniform shadowing level 500 and non-uniform shadowing level 800, it being understood that the disclosed systems and methods may alternatively be implemented with any one or more of such shadowing levels, and with additional and/or alternative types of such shadowing levels.

Figure 3:
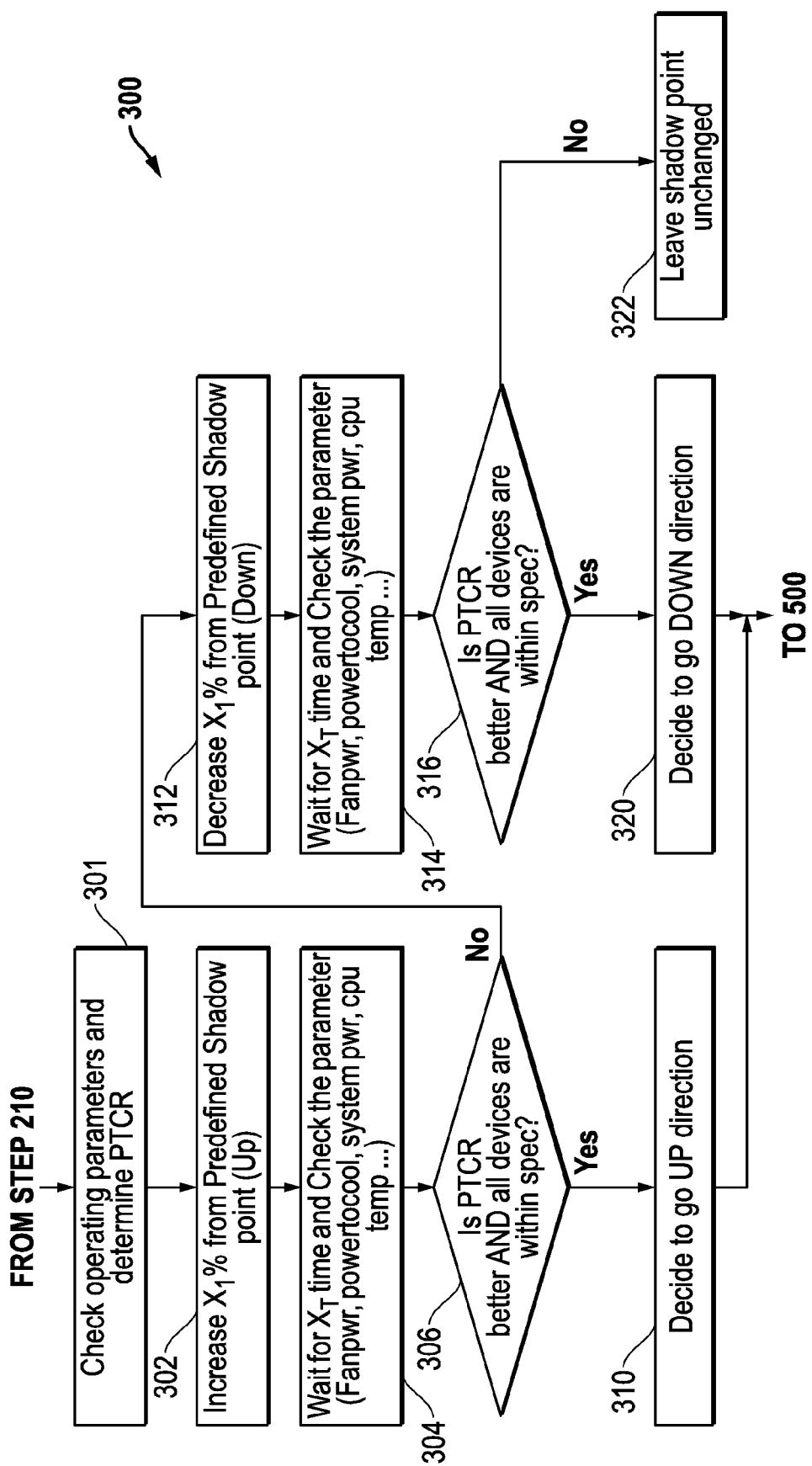
FIG. 3 illustrates methodology according to one exemplary embodiment of the disclosed systems and methods.

One exemplary embodiment of methodology for direction decision level 300 is illustrated in FIG. 3 as it may be utilized by a designated out-of-band processing device 108 to determine the direction UP (increase) or DOWN (decrease) to be used for optimizing shadowing point value based on sampling PTCR values that result from multiple stages of increasing and decreasing offsets from a starting shadowing point value, it being understood that in other embodiments the disclosed systems and methods may be implemented without a direction decision level methodology to select an optimum shadow point based on best (greatest) cooling power efficiency between as few as two different shadow point values (e.g., an initial value and a single increased shadow point value or an initial value and single decreased shadow point value) for which respective cooling power efficiency values are measured. In yet another alternative embodiment, the disclosed systems and methods may be implemented using only a direction decision level methodology to select an optimum shadow point based on best (greatest) cooling power efficiency between at least one upwardly increased shadow point value and at least one downwardly decrease shadow point value for which respective cooling power efficiency values are measured.

As shown in FIG. 3, methodology 300 begins in step 301 for the selected given driving device (e.g., CPU 106) by using the designated out-of-band processing device 108 to retrieve initial new system operating parameter conditions (e.g., real time cooling fan speeds of fans $190_2$, $190_3$ and $190_4$; real time component temperature of CPU 106, real time component power or current consumption of CPU 106, etc.) while assigned secondary cooling fan zones $105_2$ and $105_4$ are controlled to operate to shadow fan speed of primary cooling fan zone $190_3$ by a predefined shadowing value of 90% (i.e., cooling fan speed of each of cooling fans $105_2$ and $105_4$ is set at 90% of the current speed of cooling fan $190_3$ as determined based on thermal table relationship and real time temperature of CPU 106). Using these determined initial system operating parameter conditions, out-of-band processing device 108 then calculates an initial PTCR value using the following relationship: PTCR=Total cooling fan power consumption for system ($P_{CF}$)/Total system power consumption ($P_{SYS}$). In this embodiment, $P_{CF}$ represents the total power consumption of all system cooling fans 190 of information handling system 100, and $P_{SYS}$ represents the total power consumption of all power-consuming components of information handling system 100. In one embodiment, $P_{CF}$ may be determined by processing device 108 based on the total power consumption of all individual fans 190 of system 100 as monitored by processing device 108 as described further herein. In one embodiment, PTCR values may be used as cooling power efficiency values, in which case a lower PTCR value corresponds to a greater cooling power efficiency and a higher PTCR value corresponds to a lower cooling power efficiency. Although PTCR values may be determined and utilized as cooling power efficiency values in one exemplary embodiment as described herein, it will be understood that any other determined value that is representative of device cooling power efficiency may be substituted for PTCR herein in the methodology of FIGS. 2-12.

Next, in step 302 out-of-band processing device 108 then proceeds by increasing the predefined initial shadow point relationship from Table 1 by an incremental fixed percentage ("$X_1$") for all of the assigned shadowing secondary zones determined in 210. In the current example, this fixed percentage value $X_1$ may be, for example, retrieved from stored OSP data 145 and then added to the predefined 90% shadowing percentage of each of shadowing secondary cooling fan zones $105_2$ and $105_4$ assigned to the primary cooling fan $190_3$ of driving device CPU 106. Any suitable selected or user-configurable fixed percentage value $X_1$ may be employed and in one embodiment the fixed percentage value $X_1$ may be selected to be less than the initial shadow point percentage value, e.g., such as $X_1$=5% although any greater or lesser value may be employed such as 1%, 10%, etc. Next, in step 304, the designated out-of-band processing device 108 may wait for a predefined amount of time "$X_T$" (i.e., while secondary cooling fan zones $105_2$ and $105_4$ operate at the new increased 95% shadow point of primary cooling fan $190_3$ speed) before determining the new system operating parameter conditions (e.g., real time cooling fan speeds and power or current consumption of fans $190_2$, $190_3$ and $190_4$; real time component temperature of CPU 106, real time component power or current consumption of CPU 106, etc.).

In one embodiment, value of $X_T$ may be any selected predefined amount of time that is suitable for allowing sufficient time for PTCR value to substantially stabilize and for temperature of heat-producing components to substantially stabilize in response to the new cooling fan speed/s.

For example, in one embodiment, the value of $X_T$ may be from about 60 seconds to about 300 seconds, alternatively from about 120 seconds to about 240 seconds, further alternatively about 180 seconds, although value of $X_T$ may be less than 60 seconds and greater than 300 seconds in other embodiments. Using these determined new system operating parameter conditions, out-of-band processing device 108 then calculates a new PTCR and compares this new PTCR to the initial PTCR value in step 306. If the new PTCR value is found to be better (i.e., a lesser value) than the initial PTCR value while all system heat-producing component devices remain within their operating condition specifications, then increased power savings (e.g., PTCR values) are confirmed in step 306 and methodology 300 proceeds to step 310. Then in step 310 a decision is made to utilize an upward adjustment of shadow point relationship (e.g., percentage) and methodology 300 proceeds to the next second level non-uniform shadowing methodology 500 of FIG. 5.

In one alternate embodiment, methodology 300 may optionally repeat from step 306 to step 302 where the previous shadow relationship value is again increased by $X_1$ percentage and steps 304-306 repeated again. In this regard, steps 302-306 may optionally repeat in this manner up to a pre-defined number of times (e.g., from about 2 to about 5 times) before making a final decision in step 306. In such an alternate embodiment, PTCR values for each of the pre-defined multiple iterations are compared, and the adjusted shadow value corresponding to the lowest PTCR value is then selected as the best PTCR value. This selected best PTCR value may then be compared to the initial PTCR value in step 306 in the manner as previously described.

Still referring to step 306, if the new PTCR value is not found to be better (i.e., a lesser value) than the initial PTCR value while all devices remain within operating condition specification, then methodology 300 proceeds to step 312 where out-of-band processing device 108 then proceeds by decreasing the predefined initial shadow point relationship from Table 1 by a fixed percentage ("$X_1$") for all of the assigned shadowing secondary zones determined in 210. As before, this fixed percentage value $X_1$ may be, for example, retrieved from stored OSP data 145 (e.g., such as $X_1$=5% or any other suitable value as previously described for step 302, it being understood that $X_1$ value selected for step 312 may be different than $X_1$ value selected for step 302). Selected $X_1$ value of step 312 may then be subtracted from the 90% predefined shadowing percentage of each of shadowing secondary cooling fans $190_2$ and $190_4$ of secondary cooling fan zones $105_2$ and $105_4$ that are assigned to the primary cooling fan $190_3$ mapped to driving device CPU 106, although in other embodiments a different fixed percentage value may be subtracted in step 312 than is added in step 302. Next, in step 314, the designated out-of-band processing device 108 may wait for the predefined amount of time "$X_T$" (e.g., while secondary cooling fan zones $105_2$ and $105_4$ operate at the new decreased 85% shadow point of primary cooling fan $190_3$ speed) before determining the new system operating parameter conditions (e.g., real time cooling fan speeds of fans $190_2$, $190_3$ and $190_4$; real time component temperature of CPU 106, real time component power or current consumption of CPU 106, etc.). It will be understood that $X_T$ of step 314 may be selected to be the same or different than $X_T$ of step 304. Using these determined new system operating parameter conditions, out-of-band processing device 108 then calculates a new PTCR and compares this new PTCR to the initial PTCR value in step 316. If the new PTCR value is found to be better (i.e., a lesser value) than the previous PTCR value while all devices remain in specification, then methodology 300 proceeds to step 318.

If the new PTCR value is found to be better (i.e., a lesser value) than the initial PTCR value while all system heat-producing component devices remain within their operating condition specifications, then increased power savings (e.g., PTCR values) are confirmed in step 316 and methodology 300 proceeds to step 320. Then in step 320 a decision is made to utilize a downward adjustment of shadow point relationship (e.g., percentage) and methodology 300 proceeds to the next second level non-uniform shadowing methodology 500 of FIG. 5.

In one alternate embodiment, methodology 300 may optionally repeat from step 316 to step 312 where the previous shadow relationship value is again decreased by $X_1$ percentage and steps 314-316 repeated again. In this regard, steps 312-316 may optionally repeat in this manner up to a pre-defined number of times (e.g., from about 2 to about 5 times) before making a final decision in step 316. In such an alternate embodiment, PTCR values for each of the pre-defined multiple iterations are compared, and the adjusted shadow value corresponding to the lowest PTCR value is then selected as the best PTCR value. This selected best PTCR value may then be compared to the initial PTCR value in step 316 in the manner as previously described.

Still referring to step 316, if the new PTCR value is not found to be better (i.e., a lesser value) than the previous PTCR value while all devices remain in specification, then methodology 300 proceeds to step 322 where out-of-band processing device 108 makes the determination to leave the shadow point relationship at its original predefined value (e.g., 90% shadowing point) and methodology 300 terminates in step 322 without changing the initial shadow point relationship.

In another alternate and optional embodiment, each of the steps of 302-306 and the steps of 312-316 may always be performed such that both increase in shadow point relationship and decrease in shadow point relationship are performed, and respective new PTCR values are always determined for both of steps 306 and 316. In such a case, the final PTCR values of steps 306 and 316 may be compared to each other to determine which of the two PTCR values (306 or 316) is the best (i.e., lowest), and then an upward adjustment direction for methodology 500 is decided if step 306 results in a lower PTCR value than step 316, and a downward adjustment direction for methodology 500 is decided if step 366 results in a lower PTCR value than step 306. In the case where step 306 final results in the same final PTCR value as does step 316, then an upward adjustment direction for methodology 500 may be automatically decided in one embodiment under this condition, and a downward adjustment direction may be automatically decided in another embodiment under this condition. In any of the direction decision level embodiments described in the paragraphs above, it will be understood that it is not necessary to start with an increase in shadow point relationship by $X_1$ but rather, for example, steps 302-306 may be interchanged in position with steps 312-316 such that methodology 300 starts with a decrease in shadow point relationship by $X_1$.

Figure 4:
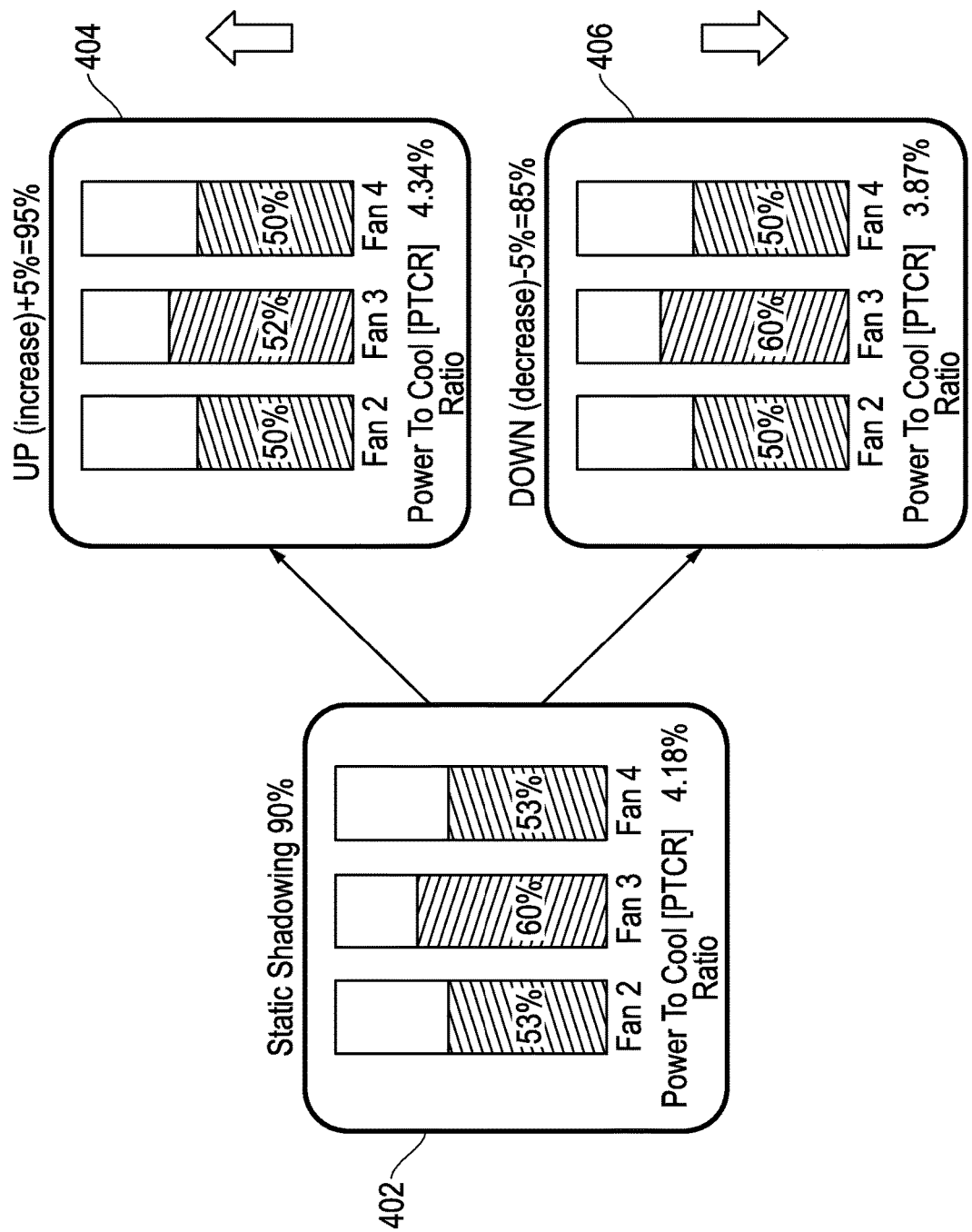
FIG. 4 illustrates results of decision level methodology according to one exemplary embodiment of the disclosed systems and methods.

FIG. 4 illustrates exemplary results of decision level methodology 300 for the current example of primary cooling fan 190₃ of primary cooling fan zone 105₃ that is mapped to selected given driving device CPU 106, and with assigned shadowing secondary cooling fans 190₂ and 190₄ of respective secondary cooling fan zones of 105₂ and 105₄. As shown in FIG. 4, the original predefined shadowing value 402 of 90% determined in first iteration of step 306 results in a PTCR of 4.18%, and where subsequent determinations of steps 308 and 318 result in new PTCR values 404 and 406 of 4.34% and 3.87% respectively. Thus, in this example the result from decision level methodology 300 would be to change the shadowing point in the downward direction in order to increase PTCR.

Figure 5:
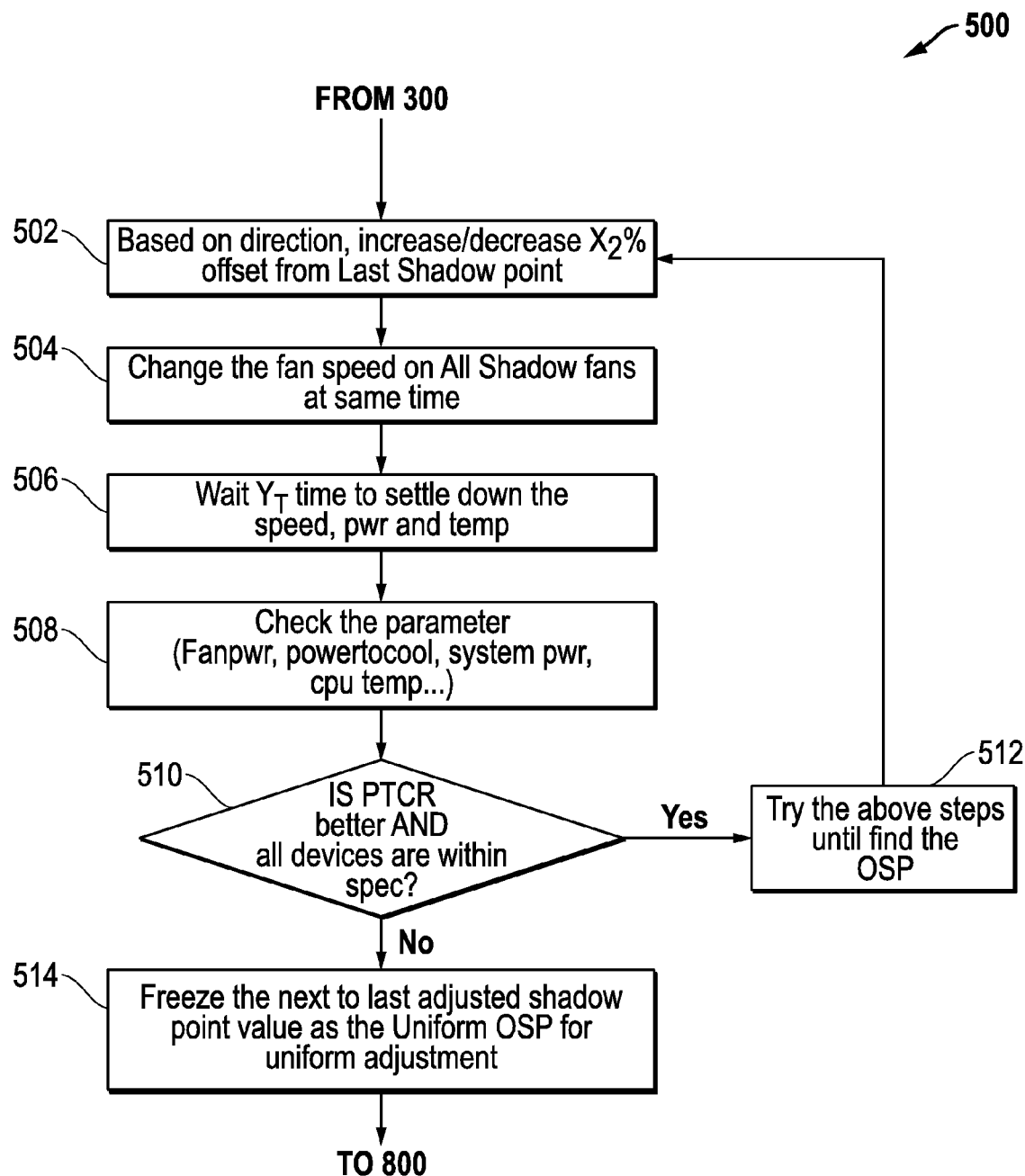
FIG. 5 illustrates methodology according to one exemplary embodiment of the disclosed systems and methods.

One exemplary embodiment of methodology for uniform shadowing level 500 is illustrated in FIG. 5. As shown, methodology 500 begins in step 502 where out-of-band processing device increases or decreases the last or previous shadowing relationship (e.g., initially 90% in the current example) by an incremental fixed percentage value ("$X_2$") based on the determined direction (up or down) from methodology 300, i.e., increase shadowing point by $X_2$ value (e.g., to 95% for the first iteration) if the determined direction from methodology 300 is up, or decrease shadowing point by $X_2$ value (e.g., to 85% for the first iteration) if the determined direction from methodology 300 is down. In one embodiment, $X_2$ may be retrieved from stored OSP data 145 and may be the same value as $X_1$ used in methodology 300, although this is not necessary. In this regard, $X_2$ may be any suitable selected or user-configurable fixed percentage value, and in one embodiment the fixed percentage value $X_2$ may be chosen to be less than the initial shadow point percentage value, e.g., such as $X_2$=5% although any greater or lesser value may be employed such as 1%, 10%, etc.

Methodology 500 then proceeds to step 504 where out-of-band processing device 108 simultaneously changes the fan speed on all shadowing fans (e.g., secondary cooling fans 190₂ and 190₄ of respective secondary cooling fan zones 105₂ and 105₄) assigned to shadow the primary cooling fan 190₃ mapped to driving device (e.g., CPU 106) to the new increased or decreased offset shadow point of step 502. Then in step 506 out-of-band processing device 108 may optionally wait for a predefined amount of time "$Y_T$" (e.g., while cooling fan zones 105₂ and 105₄ operate at the new increased 95% or decreased 85% shadow point of the real time primary cooling fan 190₃ speed) before determining the new system operating parameter conditions in step 508 (e.g., real time cooling fan speeds and power or current consumption of fans 190₂, 190₃ and 190₄; real time component temperature of CPU 106, real time component power or current consumption of CPU 106, etc.).

In one embodiment, value of $Y_T$ may be any selected predefined amount of time that is suitable for allowing sufficient time for PTCR value to substantially stabilize and for temperature of heat-producing components to substantially stabilize in response to the new cooling fan speed/s. For example, in one embodiment, the value of $Y_T$ may be from about 60 seconds to about 300 seconds, alternatively from about 120 seconds to about 240 seconds, further alternatively about 180 seconds, although value of $Y_T$ may be less than 60 seconds and greater than 300 seconds in other embodiments. Using these determined new system operating parameter conditions of step 508, out-of-band processing device 108 then calculates a new PTCR in step 510 and compares this new PTCR to the previous PTCR value (which is the initial PTCR value for the first iteration) in step 510. If the new PTCR value is found in step 510 to be better (i.e., a lesser value) than the previous PTCR value while all heat-producing component devices remain within their operating condition specifications, then methodology 500 proceeds to step 512 and iteratively repeats to step 502 using the increased or decreased offset shadow point of previous iteration of step 502 as the starting point last or previous shadow point that is increased or decreased in the current iteration of step 502. Steps 502 to 512 then iteratively repeat as necessary as long as each iteration of steps 502-510 results in a better (decreased) PTCR while all heat-producing device remain in specification.

However, when a new PTCR value is found in step 510 to be no better (i.e., a grater or equal value) than the previous PTCR value while all heat-producing component devices remain within their operating condition specifications, then methodology 500 terminates in step 514 by freezing or stopping methodology 500 from any further iteration for all assigned shadowing zones (e.g., cooling fan zones $105_2$ and $105_4$). In step 514 the uniform OSP value is also set to be equal to the adjusted (increased or decreased) shadowing relationship value of the next to last iteration of steps 502-510 (i.e., set equal to the shadow point value determined before the just completed iteration of steps 502-510 that did not result in a better PTCR value). This uniform OSP may be optionally stored as a new increased or decreased offset shadow point value in OSP data on persistent storage 140. Methodology 500 then proceeds to the next third level non-uniform shadowing methodology 800 of FIG. 8.

Figure 6:
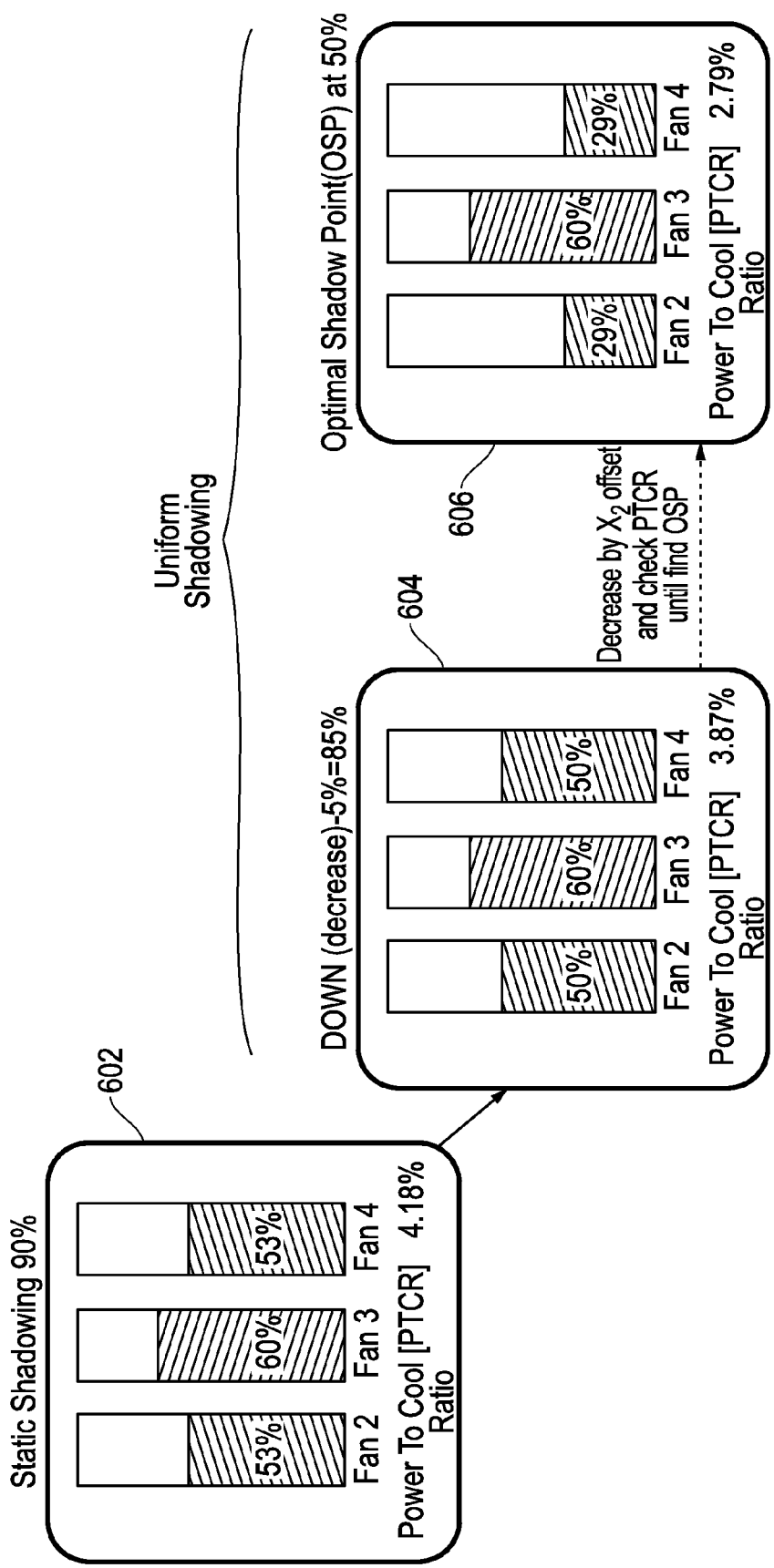
FIG. 6 illustrates results of uniform shadowing level methodology according to one exemplary embodiment of the disclosed systems and methods.

FIG. 6 illustrates exemplary results of uniform shadowing level methodology 500 for the current example of primary cooling fan $190_3$ of primary cooling fan zone $105_3$ that is mapped to selected given driving device CPU 106, and with assigned shadowing secondary cooling fans $190_2$ and $190_4$ of respective secondary cooling fan zones of $105_2$ and $105_4$. As shown in FIG. 6, for the current example the starting point original predefined static uniform shadowing value 602 of 90% for both assigned shadowing secondary cooling fans $190_2$ and $190_4$ results in a PTCR of 4.18%, as similarly determined in first iteration of step 306 of direction decision level methodology 300. As was previously shown by a comparison of values 404 and 406 of FIG. 4, the result of direction decision level methodology 300 for this example is to decrease the shadow point in order to decrease the PTCR. Thus, in the current example, the first iteration of step 502 of uniform shadowing level methodology 500 begins in step 502 by decreasing the predefined uniform shadow point value 602 of 90% by an $X_2$ offset of 5% to a new uniform shadow point 604 of 85% for both assigned shadowing secondary cooling fans $190_2$ and $190_4$ to yield a PTCR of 3.87%.

Figure 7:
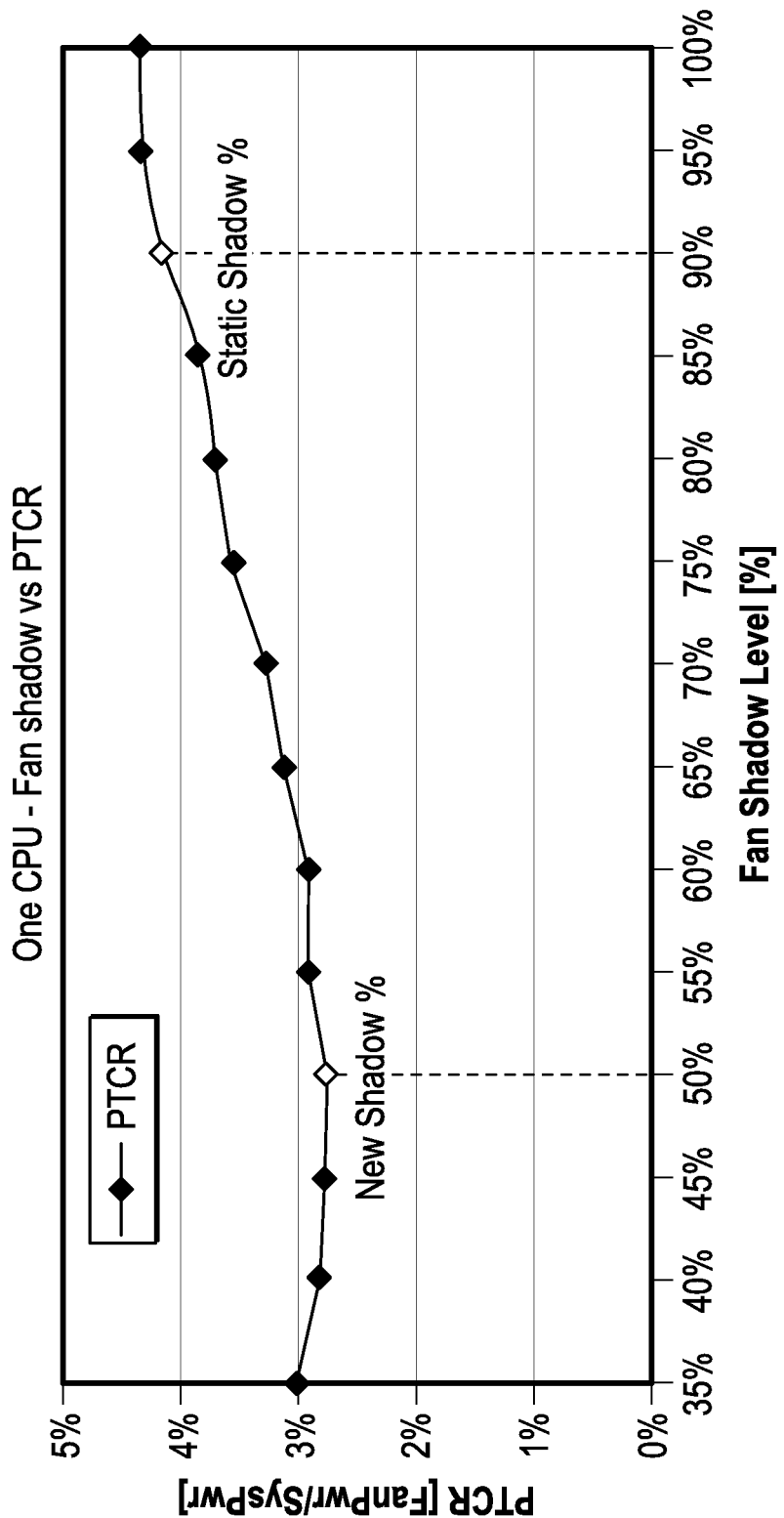
FIG. 7 illustrates uniform fan shadow values versus determined PTCR values according to one exemplary embodiment of the disclosed systems and methods.

In this example, steps 502 to 512 of FIG. 5 iteratively repeat by decreasing shadow point by increments of $X_2$ until PTCR no longer decreases at uniform shadow point value 606 of 50% that yields minimum PTCR of 2.79%. At this point, the 50% uniform shadow point is frozen from any further iteration (and optionally stored in OSP data 145) in step 514 as the OSP. FIG. 7 illustrates uniform fan shadow values versus determined PTCR values for the above-described current example, in which 50% uniform shadow point results in minimum PTCR value that is frozen and stored in OSP data 145, it being understood that methodology 500 may terminate data collection at the first adjusted shadow point that results in no PTCR improvement, or alternatively may proceed in another embodiment to gather additional confirmation PTCR data points as shown. FIG. 14 illustrates exemplary data such as may be collected and employed (e.g., by dynamic shadowing control logic 142) to determine corresponding PTCR and shadow point results described in relation to uniform shadowing methodology 500 of FIGS. 5-7 for an exemplary configuration of a system 100 including N=6 cooling fan zones and two PSUs 111, once again it being understood that methodology 500 may terminate data collection at the first adjusted shadow point that results in no PTCR improvement, or alternatively may proceed in another embodiment to gather additional confirmation PTCR data points as shown. In the embodiment of FIG. 14, power production of the multiple (in this case two) system PSUs 111 are totaled to determine total system power $P_{SYS}$, "CPU target" represents the CPU target operating temperature in ° C., and the minimum PTCR of 2.79% is designated as "SweetSpot". In an embodiment with one PSU 111, then total system power $P_{SYS}$ is equal to the power production of the single PSU 111. It will be understood that similar data collection and management may be employed for direction decision methodology 300 and non-uniform shadowing methodology 800.

Figure 8:
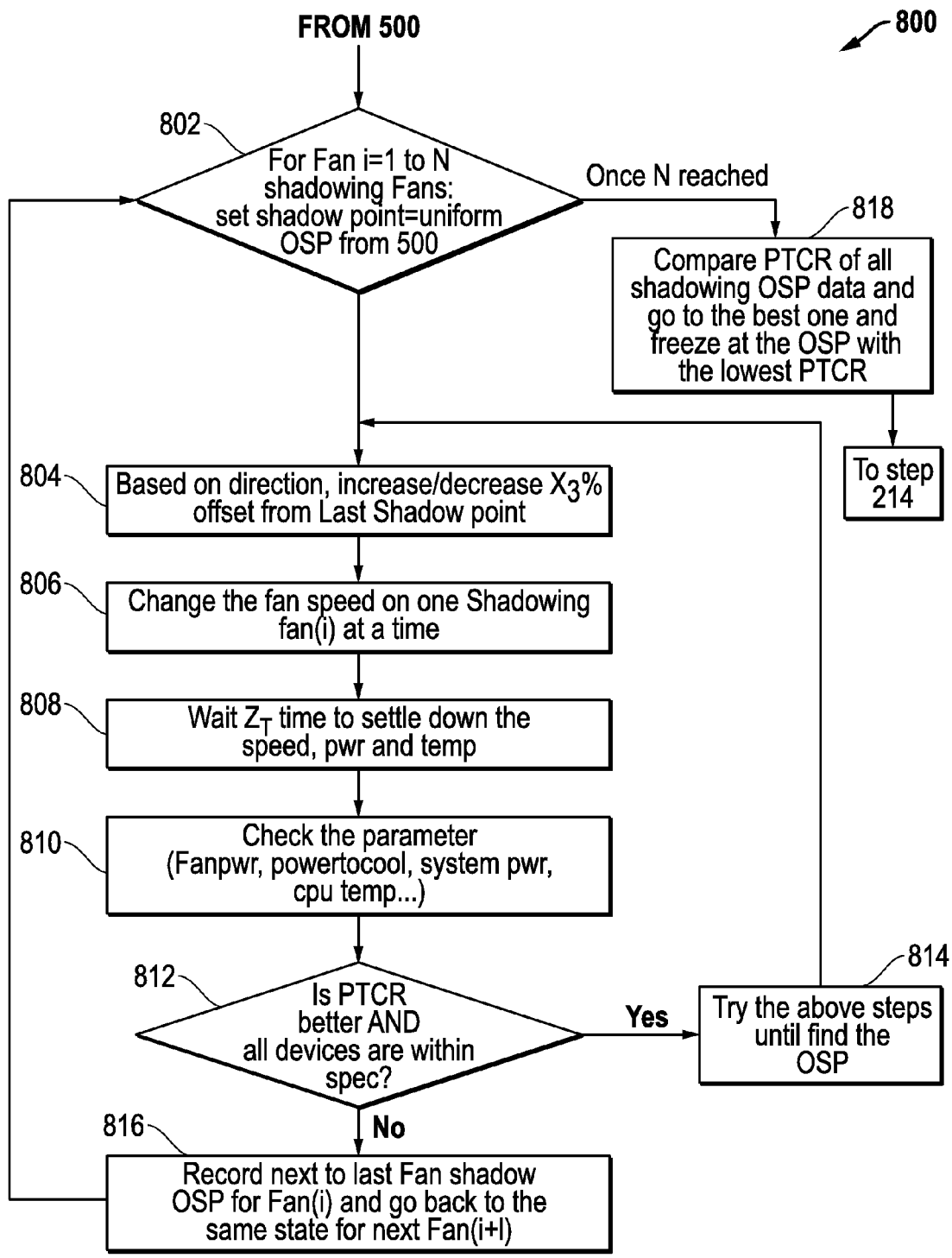
FIG. 8 illustrates methodology according to one exemplary embodiment of the disclosed systems and methods.

One exemplary embodiment of methodology for optional non-uniform shadowing level 800 is illustrated in FIG. 8. As shown, methodology 800 begins in step 802 where out-of-band processing device 108 starts with the uniform OSP determined in methodology 500 (e.g., uniform shadow point value 606 of 50% from FIG. 6). Methodology 800 then sequentially selects each of the different assigned shadowing secondary cooling fans 190 assigned to the primary cooling fan 190 that is mapped to the current selected given driving device for separate non-uniform OSP determination using steps 804 to 816 while at the same time leaving cooling fan shadow point for all other cooling fan/s 190 unchanged, before moving to the next assigned shadowing cooling fan 190 to separately repeat the same process for the next secondary cooling fan 190. In the current example, secondary cooling fans $190_2$ and $190_4$ of respective shadowing secondary cooling fan zones $105_2$ and $105_4$ are assigned to primary cooling fan $190_3$ that is mapped to the driving device CPU 106. Thus, N=2 for step 802, and out-of-band processing device 108 repeats steps 802 to 816 separately for each of the two shadowing cooling fans $190_2$ (i=1) and $190_4$ (i=2=N) before proceeding to step 818 as described further below. It will be understood that it is possible that a group of two or more secondary cooling fans 190 may be assigned to a given secondary cooling fan zone 105 that itself shadows a primary cooling fan 190 that is mapped to a driving device, in which case each steps 802 to 816 of methodology 800 may alternatively be performed for each such group of two or more secondary fans 190 assigned to a given assigned shadowing secondary cooling fan zone 105, i.e., with the shadow point and cooling fan speeds of the multiple secondary fans 190 of a given group of a common secondary zone 105 being simultaneously increased or decreased together in steps 804 and 806 rather than on a single fan basis.

In step 804 of methodology 800, out-of-band processing device 108 increases or decreases the uniform OSP determined from uniform shadowing methodology 500 (e.g., 50% in the current example) to a new shadow point for only a single selected shadowing secondary cooling fan 190 (or zone 105) by an incremental fixed percentage value ("$X_3$") in the same direction (up or down) as the determined direction from methodology 300, e.g., uniform OSP of 50% for i=1 cooling fan 1092 decreased by $X_3$ (e.g., 5%) to be 45% in the current example. In one embodiment, $X_3$ may be any suitable selected or user-configurable fixed percentage value and may be retrieved from stored OSP data 145. In one embodiment, $X_3$ may be the same value as $X_1$ used in methodology 300 and/or $X_2$ used in methodology 500, although this is not necessary. In this regard, $X_3$ may be any suitable fixed percentage value, and in one embodiment the fixed percentage value $X_3$ may be chosen to be less than the initial uniform OSP shadow point percentage value, e.g., such as $X_3$=5% although any greater or lesser value may be employed such as 1%, 10%, etc. The fan speed of the currently selected single secondary fan 190 (or alternatively the multiple secondary fans of a selected single secondary cooling fan zone 105) is then changed in step 806 according to the new offset shadow point of step 804 (e.g., such as 45% of the real time current fan speed of cooling fan $190_3$).

Next, in step 808, out-of-band processing device 108 may optionally wait for a predefined amount of time "$Z_T$" while the currently selected secondary cooling fan 190 (or group of secondary cooling fans 190 of the currently selected secondary cooling fan zone 105) operates at the new increased or decreased shadow point (e.g., decreased 45% shadow point of the primary cooling fan $190_3$ speed in the current example) before determining the new system operating parameter conditions in step 810 (e.g., real time cooling fan speeds and power or current consumption of fans $190_2$, $190_3$ and $190_4$; real time component temperature of CPU 106, real time component power or current consumption of CPU 106, etc.).

In one embodiment, value of $Z_T$ may be any selected predefined amount of time that is suitable for allowing sufficient time for PTCR value to substantially stabilize and for temperature of heat-producing components to substantially stabilize in response to the new cooling fan speed/s. For example, in one embodiment, the value of $Z_T$ may be from about 60 seconds to about 300 seconds, alternatively from about 120 seconds to about 240 seconds, further alternatively about 180 seconds, although value of $Z_T$ may be less than 60 seconds and greater than 300 seconds in other embodiments.

Using these determined new system operating parameter conditions, out-of-band processing device 108 then calculates a new PTCR in step 812 and compares this new PTCR to the previous PTCR value (which is the last PTCR value corresponding to the determined uniform OSP of methodology 500 for the first iteration) in step 812. If the new PTCR value is found in step 812 to be a value that is less (better) than the previous PTCR value while all devices remain within specifications, then methodology 800 repeats back to step 804 and again increases or decreases (as appropriate) the previous offset OSP shadow value determined during the last iteration of step 804 by a further $X_3$ value and repeats steps 806 to 814 until PTCR is found to be a greater than or equal value than the previous PTCR value while all heat-producing component devices remain within operating specifications, and then proceeds to step 816 and records and stores the current offset shadow point of step 804 for the current secondary cooling fan 190 or secondary cooling fan zone 105 in a manner described further below.

If the new PTCR value is found in step 812 to be a value that is no better than the previous PTCR value (i.e., meaning that the new PTCR is greater than or equal to the previous PTCR value) while all devices remain within operating condition specifications, then methodology 800 proceeds to step 816 and records and stores the offset shadow point from the next to last iteration of steps 804-812 (i.e., the offset shadow point value determined before the just completed iteration of steps 804-812 that did not result in a better PTCR value) for the current secondary cooling fan 190 (e.g., i=1 secondary cooling fan 1092 in the current example) in OSP data 145 of persistent storage 140, or alternatively for the current secondary cooling fan zone 105 where applicable. Methodology 800 then returns to step 802 to repeat steps 804 to 816 for the next different (e.g., i=2) selected shadowing secondary cooling fan 190 (or shadowing secondary cooling fan zone 105) starting over each time with the same uniform OSP determined from uniform shadowing methodology 500 (e.g., 50% in the current example).

Figure 9:
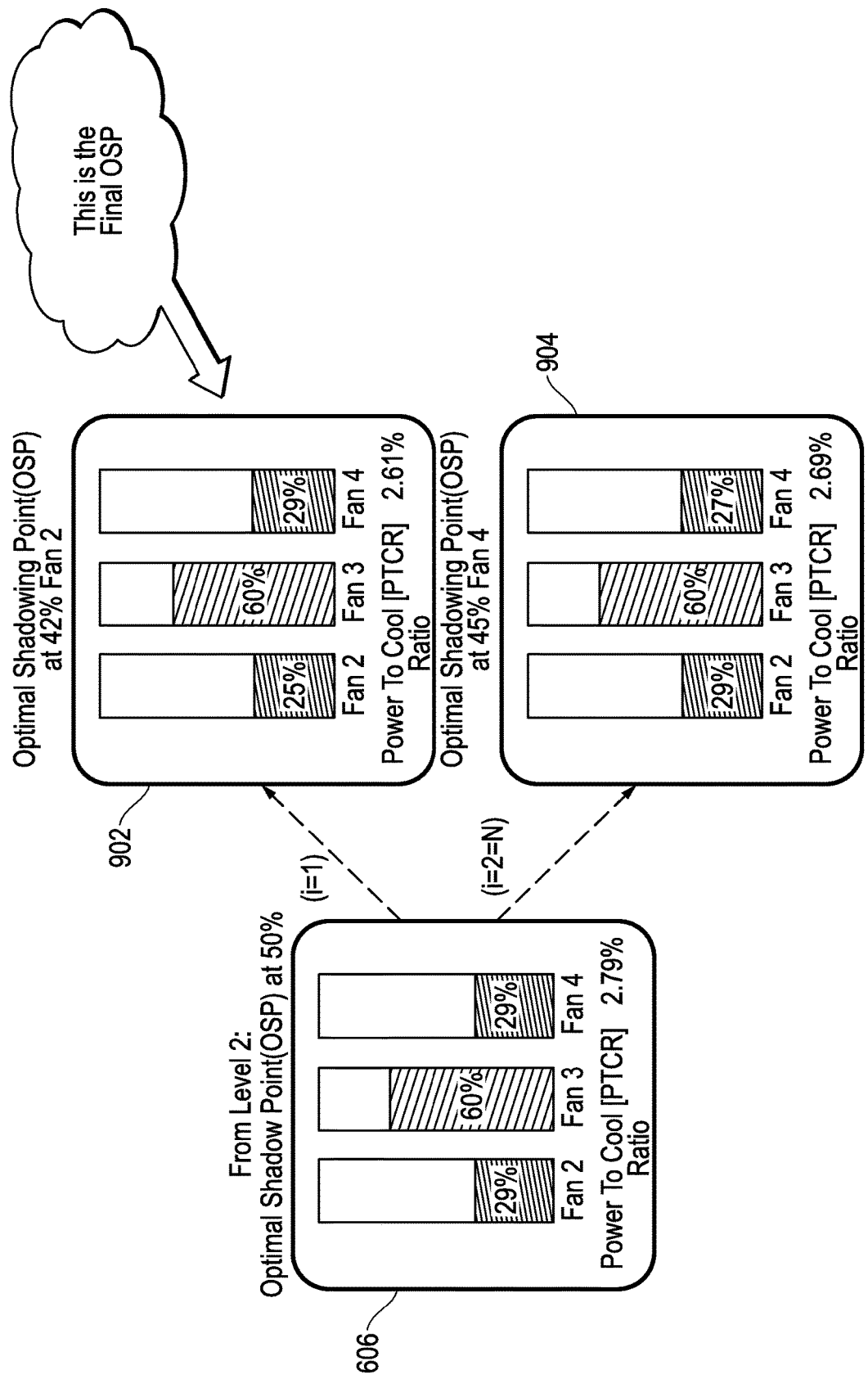
FIG. 9 illustrates results of non-uniform uniform shadowing level methodology according to one exemplary embodiment of the disclosed systems and methods.
Figure 10:
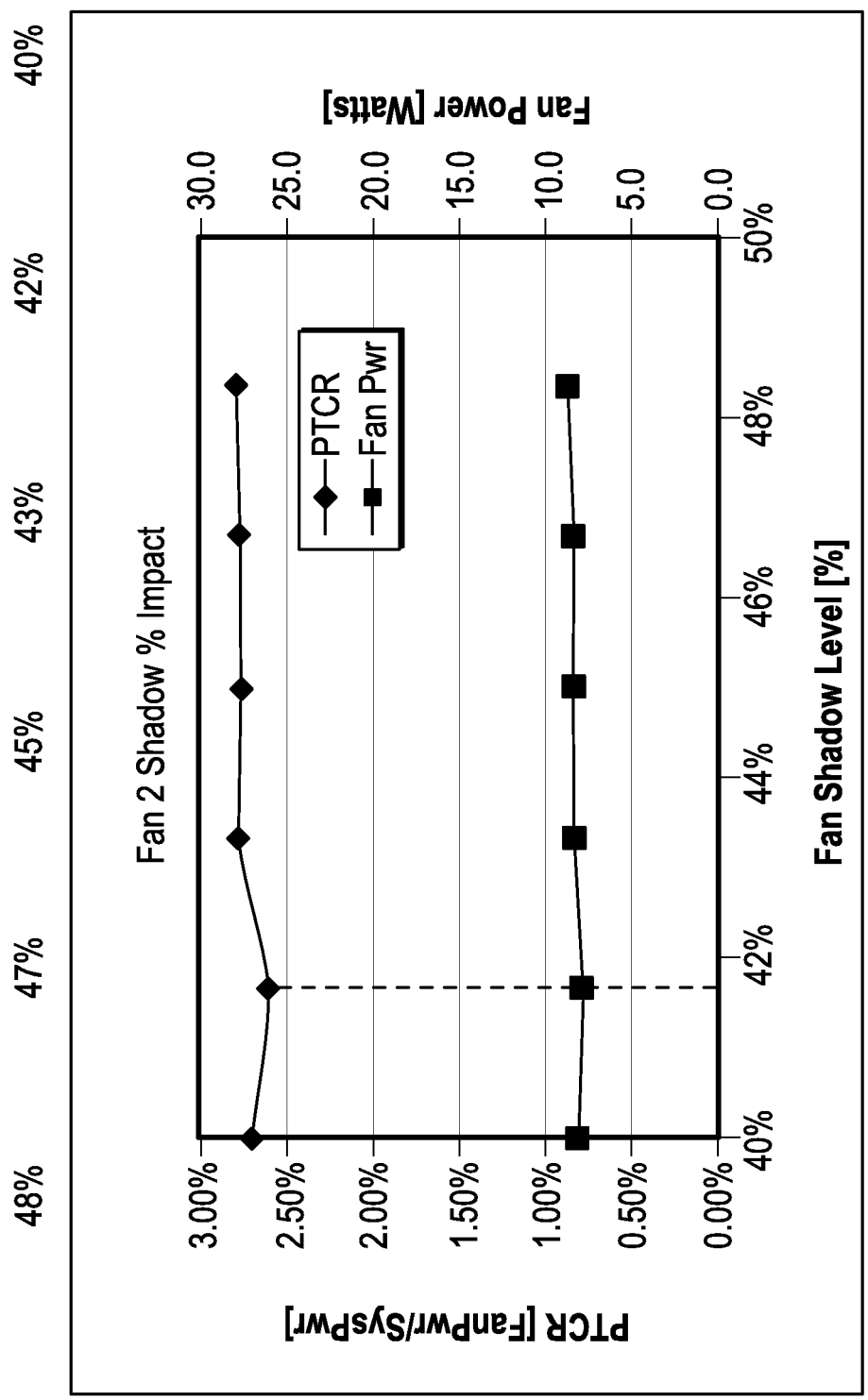
FIG. 10 illustrates fan shadow values and fan power versus PTCR values determined using a first individual secondary cooling fan according to one exemplary embodiment of the disclosed systems and methods.

Once steps 802 to 816 have been performed individually for all "N" shadowing secondary cooling fans 190 (or for all shadowing secondary cooling fan zones 195), then methodology 800 proceeds to step 818 where the determined PTCR value corresponding to each recorded non-uniform OSP value of step 816 is compared to the determined PTCR value corresponding to each of the other recorded non-uniform OSP value/s of step 816, and the individual OSP value have the best PTCR value (i.e., the lowest PTCR value) is selected as shown in FIG. 9 and frozen from further iteration.

Methodology 800 then proceeds to step 214 of methodology 200 of FIG. 2 where the frozen non-uniform OSP values from step 818 are stored in OSP data 145 on persistent storage 140 for future use for controlling the cooling fan speeds of assigned shadowing secondary cooling fan/s 190 (e.g., secondary cooling fans $190_2$ and $190_4$) or assigned cooling secondary fan zones 105 (e.g., secondary cooling fans $105_2$ and $105_4$) based on the real time fan speed of the primary cooling fan 190 (e.g., primary cooling fan $190_3$) mapped to the selected given driving device (e.g., CPU 106) during normal operation of information handling system 100. Methodology 200 then waits in step 216 until out-of-band processing device 108 detects via communication path 103 the occurrence of a next major event such as change to a different system configuration (e.g., removal, replacement, and/or addition of different heat-producing component/s such as processing devices, etc.), change in computational and/or power demand stress loads (e.g., such as may be reported to or detected by processing device 108, etc.), change in system environment (e.g., such as an air temperature increase occurring outside the chassis as sensed by an external temperature sensor coupled to the processing device 108, etc.), and/or change from previously established steady state operation. When out-of-band processing device 108 detects occurrence of such a major event, then methodology 200 returns to step 202 and repeats again after occurrence of the detected major event.

FIG. 9 illustrates exemplary results of non-uniform shadowing level methodology 800 for the current example of primary cooling fan $190_3$ of cooling fan zone $105_3$ that is mapped to selected given driving device CPU 106, and with assigned shadowing secondary cooling fans $190_2$ and $190_4$ of respective secondary cooling fan zones of $105_2$ and $105_4$. As shown in FIG. 9, the starting shadow point value 606 for step 802 of non-uniform shadowing level methodology 800 is the uniform OSP obtained from step 514 of uniform shadowing level methodology 500, e.g., 50% for the current example where secondary cooling fans $190_2$ and $190_4$ of secondary cooling fan zones $105_2$ and $105_4$ are assigned to shadow primary cooling fan $190_3$ of cooling fan zone $105_3$ mapped to CPU 106. As shown in FIG. 9 and the corresponding plot of FIG. 10, performance of steps 802 to 816 of methodology 800 for individual secondary cooling fan $190_2$ (i=1) results in non-uniform OSP 902 of about 42% of the 60% real time cooling fan speed of mapped primary cooling fan $190_3$ while secondary cooling fan $190_4$ remains unchanged at about 50% of the real time 60% cooling fan speed of mapped primary cooling fan $190_3$, with this OSP 902 corresponding to a PTCR of 2.61%.

Figure 11:
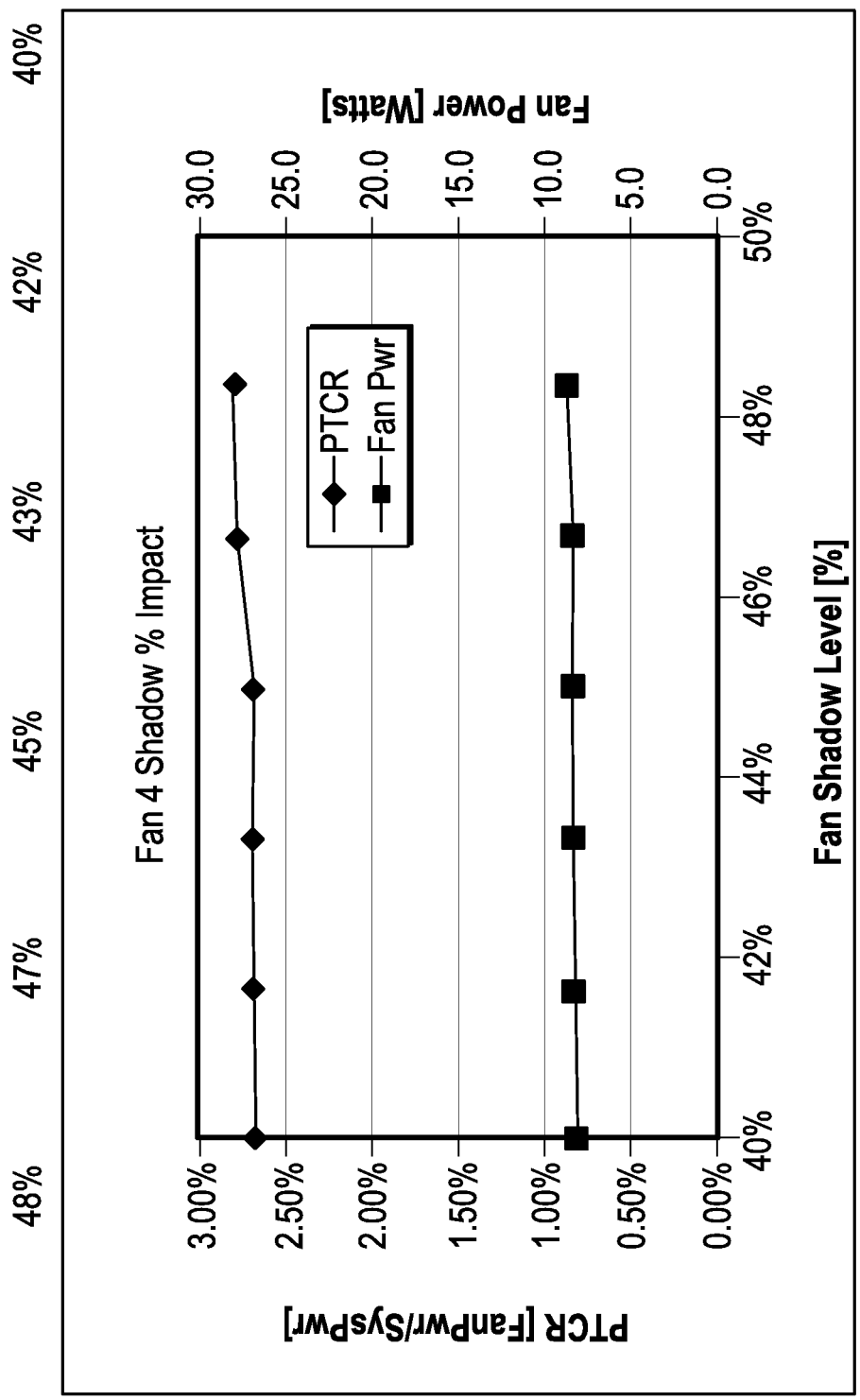
FIG. 11 illustrates fan shadow values and fan power versus PTCR values determined using a second individual secondary cooling fan according to one exemplary embodiment of the disclosed systems and methods.

As further shown in FIG. 9 and the corresponding plot of FIG. 11, performance of steps 802 to 816 of methodology 800 for individual secondary cooling fan $190_4$ (i=2=N) results in non-uniform OSP 904 of about 45% of the 60% real time cooling fan speed of mapped primary cooling fan $190_3$, while cooling fan $190_2$ remains unchanged at about 50% of the real time 60% cooling fan speed of mapped primary cooling fan $190_3$, with this OSP 904 corresponding to a PTCR of 2.69%. Thus, non-uniform OSP 902 of about 42% of the 60% real time cooling fan speed of mapped primary cooling fan $190_3$ is selected and frozen in step 818 (for use in step 214) as the best and final OSP for step 214 since the PTCR=2.61% at OSP 902 is less than the PTCR=2.69% at OSP 904.

Figure 12:
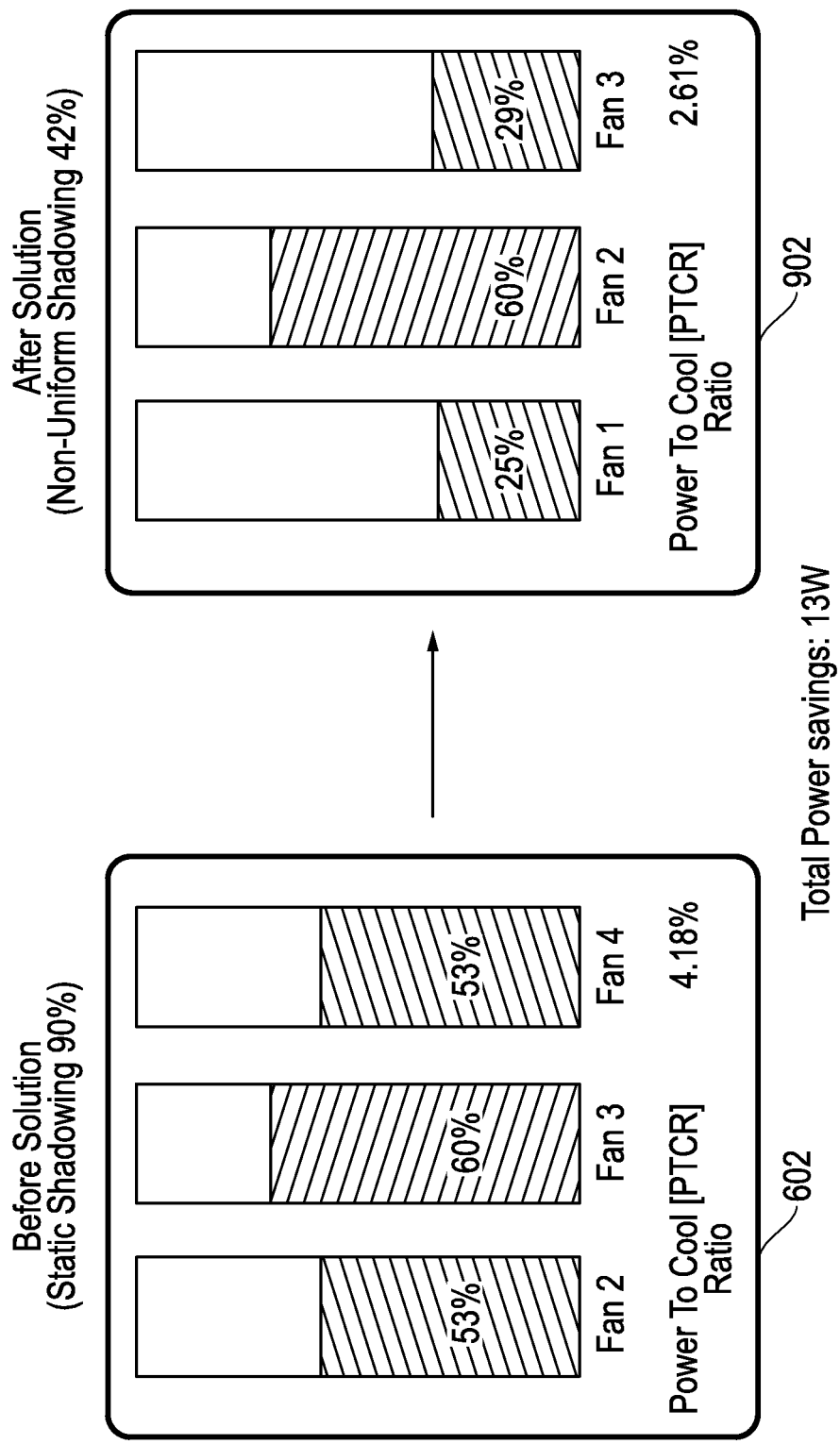
FIG. 12 illustrates a comparison between original predefined static uniform shadowing value assigned shadowing secondary cooling fans and final selected non-uniform OSP.

FIG. 12 illustrates the original predefined 90% static uniform shadowing value 602 from step 301 of FIG. 3 for both assigned shadowing secondary cooling fans $190_2$ and $190_4$ compared to the final selected non-uniform OSP 902 from step 818 that are stored in step 214 of persistent storage 140 for future use for controlling the cooling fan speeds of assigned shadowing secondary cooling fan/s 190. As shown in FIG. 12, use of the 42% OSP 902 for controlling shadowing fans $190_2$ and $190_4$ of this example saves 13 watts of power consumption compared to using the original 90% static uniform shadowing value 602 for controlling shadowing fans $190_2$ and $190_4$. As illustrated in FIG. 2, this particular final selected OSP 902 from step 818 is utilized to control the cooling fan speeds of assigned shadowing secondary cooling fan/s $190_2$ and $190_4$ as a percentage of real time controlled cooling fan speed of primary cooling fan $190_3$ until occurrence of the next major even it detected in steep 216 and methodology 200 repeats to step 202 and repeats.

It will be understood that the particular number and order of steps of methodologies of FIGS. 3, 5 and 8 are exemplary only, and that any other combination of additional, fewer, and/or alternative steps may be employed in each case that is suitable for controlling the fan speed of one or more secondary cooling fans of an information handling system in real time by dynamically and adaptively shadowing the fan speed of another primary cooling fan or cooling fan/s of another cooling fan zone of the same information handling system.

Figure 13:
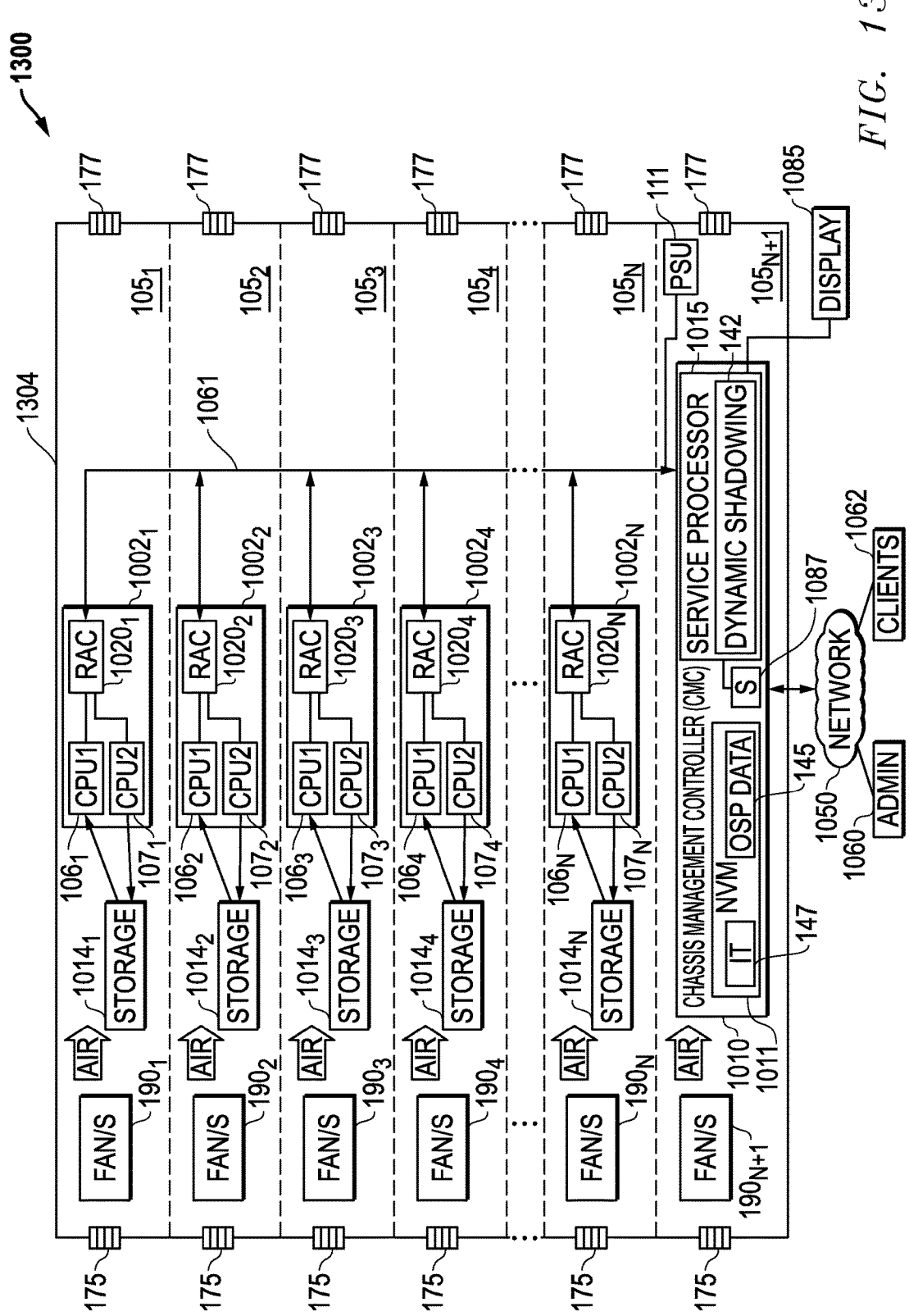
FIG. 13 illustrates an information handling system platform according to one exemplary embodiment of the disclosed systems and methods.

FIG. 13 illustrates an alternative embodiment of a modular scalable information handling system platform configured in the form of a modular blade server chassis system 1300 that includes a modular chassis enclosure 1304 having an outer structural physical framework within which multiple interchangeable modular heat-producing components 1002 and 1010 (e.g., with each including compute, networking, storage resources, etc.) are contained and disposed in adjacent side-by-side relationship, with provision for connection to various external networks and devices as shown. In this embodiment, individual interchangeable heat-producing modules 1002 and 1010 may be added and/or removed as separate modules from the system 100 (e.g., as removable and/or hot-pluggable modular components such as server blades) and/or reconfigured over time so as to change the capabilities and/or performance of the system. Connectivity between modular heat-producing components 1002 and 1010 may also be reconfigured within the chassis 1300.

Multiple cooling fans 190 are provided within enclosure 1304 in this embodiment, with multiple cooling fan zones 105 defined that each includes a given modular heat-producing component 1002 or 1010, and that each has a respective assigned cooling fan or group of cooling fans $190_1$ to $190_N$. A cooling fan zone $105_{N+1}$ is also defined in this embodiment that includes heat-producing components 1010 and 111, and has an assigned cooling fan or group of cooling fans $190_{N+1}$. It will be understood that there is open space that allows air flow around one or more sides of each of individual modular heat-producing components 1002 and 1010, and between the adjacent cooling fan zones 105.

Further, as with the embodiment of FIG. 1, some air flow generated from a given cooling fan 190 of a given cooling fan zones 105 may cross the non-physical dashed lines into one or more adjacent cooling fan zones 105 to which it is not assigned. As described in relation to FIG. 1, one or more power supplies 111 may be present to supply the power-consuming components of system 1300 (e.g., including fans 190 and heat-producing electrical components described above).

It will be understood that although FIG. 13 illustrates a particular exemplary embodiment of a modular blade server chassis system 1300, the disclosed systems and methods may be alternatively implemented with any other configuration of scalable information handling system that utilizes compute, networking and/or storage resources that are removable, hot-pluggable, or otherwise changeable over time, possibly together with the configured connectivity between these resources. Besides modular blade server systems, other examples of such scalable information handling systems include, but are not limited to, a rack server system that includes multiple modular rack servers that are each coupled to, or otherwise has connectivity to, a network (e.g., internet, intranet, etc.), for example, via a top-of-rack (ToR) switch. Further information on, and examples of, scalable information handling system platforms and their possible components include those described in United States Patent Publication No. 2014/0208136; United States Patent Publication No. 2015/0039871; and U.S. patent application Ser. No. 14/220,763, each of which is incorporated herein by reference in its entirety.

In the exemplary embodiment of FIG. 13 individual modular heat-producing electrical components 1002 may be modular compute and/or storage sleds (e.g., half-width, quarter width, full-width, etc.) that are contained within chassis enclosure 1300 (e.g., such as a 2 U, 3 U, 4 U, etc. computer chassis) such as a Dell PowerEdge FX2/FX2s available from available from Dell Products L.P. of Round Rock, Tex. In this embodiment multiple cooling fans $190_1$ to $190_N$ that are configured to cool the respective heat-producing module components 1002 and 1010, and exemplary inlet vents 175 and outlet vents 177 are shown defined in the enclosure wall of chassis enclosure 1304. In this embodiment, each of modular heat-producing components 1002 includes multiple in-band processing devices (e.g., host CPUs 106 and 107) that are coupled to respective storage 1014, although it is possible that a module 1002 may include only a single in-band processing device, more than two in-band processing devices, and/or other types of components such as one or more GPUs, volatile and/or non-volatile storage, network interface controllers (NICs), etc.

In this embodiment, each of heat-producing components 1002 also includes a respective out-of-band processing device in the form of a remote access controller 1020 (e.g., such as integrated Dell Remote Access Controller (iDRAC) available from Dell Products L.P. of Round Rock, Tex.) configured for communication with chassis management subsystem (CMC) 1010 (e.g., such as integrated Dell Remote Access Controller (iDRAC) available from Dell Products L.P. of Round Rock, Tex.). CMC module 1010 may include a service processor 1015 that is configured to execute dynamic shadowing logic 142 in a manner as previously described for out-of-band processing device 108, e.g., using thermal table information 147 and OSP data 145 that is stored on CMC non-volatile memory 1011 as shown. As shown, CMC 1010 may be coupled via network 1050 to remote administrator/s 1060 and/or one or more clients 1062 (e.g., other information handling systems via a group network switch 1087 of CMC 1010) and/or to an optional local control panel and/or display 1085 for displaying information and for local administrator interface to modular blade server chassis system 1300.

In one embodiment, CMC 1010 may be coupled and configured to monitor and/or control (and thus be aware of) total power provided by the one or more PSUs 111 to power all the power-consuming components of system 1300, and may also be coupled and configured to monitor and/or control (and thus be aware of) real time power consumption by individual power-consuming components (e.g., such as individual cooling fans 190). In this regard, CMC 1010 may be configured to directly monitor power consumption of an individual power-consuming component and/or may be configured to receive reported component power consumption from another intervening component/s (e.g., chassis power manager) of system 100, e.g., via RACs 1020 and/or such as described in U.S. Pat. No. 8,156,358 which is incorporated herein by reference in its entirety for all purposes.

In this embodiment, each of the individual heat-producing components 10021 to 1002N, or 1010 and 111, contained within enclosure 1304 are mapped to be a driving component of a respective cooling fan zone $105_1$ to $105_{N+1}$ within which the individual heat-producing component 1002, 1010 or 111 is primarily cooled by a corresponding one of primary cooling fan/s $190_1$ to $109_{N+1}$ of the same cooling fan zone 105 as illustrated by the arrows that show direction of cooling air flow. Each remote access controller $181_1$ to $181_N$ may include thermal control logic coupled to monitor temperature of the CPUs 106 and/or 107 (and/or any other heat producing components) of its respective module 1002 to determine cooling requirements for the monitored components and to generate a cooling fan speed request based on the monitored temperature and/or determined cooling requirements, and may be configured to exchange management information (e.g., requested cooling fan speed (PWM), component status, component inventory, component configuration, alerting, power status and control commands, component operation monitoring, etc.) information with CMC 1010 of system 100 across any suitable type of management communication media path 1061 (e.g., I²C bus).

CMC 1010 may in turn be configured to control the fan speed of cooling fans $190_1$ to $109_{N+1}$ (e.g., via path 1061 and/or other provided suitable data or signal communication path that may be present) to dynamically and adaptively shadow the fan speed of selected primary cooling fan/s 190 of a primary cooling fan zone 105 using other selected secondary cooling fan/s 190 in a manner similar to that described herein for out-of-band processing device 108, e.g., to maximize blade airflow efficiency by increasing fan air cubic foot per minute (CFM)/watt. Thus, the disclosed systems and methods (including methodologies of FIGS. 2, 3, 5 and 8) may be implemented to increase system cooling efficiency and/or reduce system power consumption across a variety of different variety of module configurations (with widely different impedance levels or air flow restriction levels and patterns).

In the exemplary embodiment of FIG. 13, CMC 1010 may be configured to utilize thermal table information 147 and OSP data 145 together with requested cooling fan speed received from a remote access controller 1020 of a designated primary cooling fan zone 105 (e.g., cooling fan zone $105_2$) to control the speed of one or more secondary cooling fans 190 (e.g., $190_1$ to $109_3$ of cooling fan zones $105_1$ and $105_3$) that are assigned to shadow a primary cooling fan 190 (e.g., cooling fan $190_2$ of the designated primary cooling fan zone $105_2$) of information handling system 1300 in real time by dynamically and adaptively shadowing the fan speed of the primary cooling fan 190 in the same manner are previously described with regard to FIGS. 1-12.

As an example, service processor 1075 of CMC 101 may be configured in one exemplary embodiment to implement dynamic shadowing control 142 (e.g., including a multi-level shadowing algorithm to find an OSP) to adaptively control a shadowing relationship between secondary cooling fans $190_1$ and $190_3$ that are assigned to shadow a primary cooling fan $190_2$ of cooling fan zone $105_2$ based on real time requested cooling fan speed information (e.g., PWM) received from remote access controller $1020_2$ for cooling fan speed of primary cooling fan $190_2$ across communication path 1061. In this regard, service processor 1015 may provide control data or signals to set the speed of primary cooling fan $190_2$ to the requested cooling fan speed received from remote access controller $1020_2$ and to control each of shadowing cooling fan/s $190_1$ and $190_3$ to implement the methodology described herein, and may store OSP information 145 on non-volatile memory 1011 together with any other information or data that may be utilized to implement dynamic shadowing control 142. In one embodiment, service processor 1075 of CMC 101 may be configured to ignore any real time requested cooling fan speeds for secondary cooling fans $190_1$ and $190_3$ of secondary cooling fan zones $105_1$ and $105_3$ that may be received from remote access controllers $1020_1$ and $1020_3$ across communication path 1061.

It will be understood that one or more of the tasks, functions, or methodologies described herein (e.g., including those described herein for components 106, 108, 109, 1015, 1020, etc.) may be implemented by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program comprising instructions are configured when executed (e.g., executed on a processing device of an information handling system such as CPU, controller, microcontroller, processor, microprocessor, FPGA, ASIC, or other suitable processing device) to perform one or more steps of the methodologies disclosed herein. A computer program of instructions may be stored in or on the non-transitory computer-readable medium accessible by an information handling system for instructing the information handling system to execute the computer program of instructions. The computer program of instructions may include an ordered listing of executable instructions for implementing logical functions in the information handling system. The executable instructions may comprise a plurality of code segments operable to instruct the information handling system to perform the methodology disclosed herein. It will also be understood that one or more steps of the present methodologies may be employed in one or more code segments of the computer program. For example, a code segment executed by the information handling system may include one or more steps of the disclosed methodologies.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. A method for controlling cooling fan response within a chassis enclosure of an information handling system, comprising:

operating at least one heat-producing component contained within the chassis enclosure, and using at least one temperature sensor to sense and provide a heat-producing component temperature signal representing the real time sensed temperature of the heat-producing component;

operating at least two separate variable speed cooling fans to provide different flow rates of cooling air within the chassis enclosure, at least one of the variable speed cooling fans being mapped as a primary cooling fan to cool the at least one heat-producing component and at least one of the variable speed cooling fans being a secondary cooling fan assigned to shadow the real time fan speed of the primary cooling fan; and receiving the heat-producing component temperature signal from the temperature sensor, and controlling a real time fan speed of the primary cooling fan based on the heat-producing component temperature signal to cool the heat-producing component; and further comprising:

controlling a real time fan speed of the secondary cooling fan relative to the real time controlled fan speed of the primary cooling fan based on a shadowing relationship, varying a value of the shadowing relationship so as to control the real time fan speed of the secondary cooling fan relative to the varied real time controlled fan speed and determine at least two values of cooling power efficiency associated with at least two respective different shadowing relationship values, then selecting a value of the shadowing relationship from the at least two different shadowing relationship values that corresponds to a greater cooling power efficiency between the two different shadowing relationship values, and then controlling the real time fan speed of the secondary cooling fan relative to the real time controlled fan speed of the primary cooling fan based on the selected shadowing relationship value that corresponds to a greater cooling power efficiency; and further comprising:

varying the shadowing relationship value at least one of an upward or downward direction so as to control the real time fan speed of the secondary cooling fan relative to the varied real time controlled fan speed using at least one of greater or lesser shadowing relationship values and determine a value of cooling power efficiency associated with each of the at least one greater or lesser shadowing relationship values, then selecting a value of the shadowing relationship from the at least one of greater or lesser shadowing relationship values that corresponds to a greater cooling power efficiency between the at least one of greater or lesser shadowing relationship values, and then controlling the real time fan speed of the secondary cooling fan relative to the real time controlled fan speed of the primary cooling fan based on the selected greater or lesser shadowing relationship value that corresponds to a greater cooling power efficiency; and further comprising:

controlling a real time fan speed of the secondary cooling fan relative to the real time controlled fan speed of the primary cooling fan based on an initial shadowing relationship, then varying the shadowing relationship value in at least one of an upward or downward direction from the initial shadowing relationship value so as to control the real time fan speed of the secondary cooling fan relative to the varied real time controlled fan speed using of at least one greater shadowing relationship value or at least one lesser shadowing relationship value, and determine a value of cooling power efficiency associated with each of the at least one greater or lesser shadowing relationship values, then determining if the at least one greater shadowing relationship value or at least one lesser shadowing relationship value corresponds to a greater cooling power efficiency than the initial shadowing relationship, then at least one of: selecting an upward direction for changing the shadowing relationship value if the greater shadowing relationship value corresponds to a greater cooling power efficiency than the initial shadowing relationship value, or selecting a downward direction for changing the shadowing relationship value if the lesser shadowing relationship value corresponds to a greater cooling power efficiency than the initial shadowing relationship value, then iteratively varying the shadowing relationship value in the selected upward or downward direction multiple times by a selected incremental fixed value so as to control the real time fan speed of the secondary cooling fan relative to the varied real time controlled fan speed of the primary cooling fan using each of the incrementally varied shadowing relationship values, and determining a value of cooling power efficiency associated with each of the incrementally varied shadowing relationship values, then-selecting a value of the shadowing relationship from the incrementally varied shadowing relationship values that corresponds to a greater cooling power efficiency between the different incrementally varied shadowing relationship values, and then controlling the real time fan speed of the secondary cooling fan relative to the real time controlled fan speed of the primary cooling fan based on the selected incrementally varied shadowing relationship value that corresponds to a greater cooling power efficiency.

2. The method of claim 1, further comprising
performing the following during operation of the information handling system upon the occurrence of at least one of system power-on and system booting of the information handling system, detection of a change to a different system configuration, detection of a change in computational and/or power demand stress loads, detection of change in system environment outside the chassis, and/or detection of a change in one or more of system steady state conditions of operating power load, fan speed or operating temperature operation from a previously established steady state conditions:
 controlling a real time fan speed of the secondary cooling fan relative to the real time controlled fan speed of the primary cooling fan based on a shadowing relationship,
 varying a value of the shadowing relationship so as to control the real time fan speed of the secondary cooling fan relative to the varied real time controlled fan speed and determine at least two values of cooling power efficiency associated with at least two respective different shadowing relationship values,
 then selecting a value of the shadowing relationship from the at least two different shadowing relationship values that corresponds to a greater cooling power efficiency between the two different shadowing relationship values, and
 then controlling the real time fan speed of the secondary cooling fan relative to the real time controlled fan speed of the primary cooling fan based on the selected shadowing relationship value that corresponds to a greater cooling power efficiency.

3. The method of claim 1, further comprising:
 varying the shadowing relationship value both upward and downward so as to control the real time fan speed of the secondary cooling fan relative to the varied real time controlled fan speed using each of a greater and lesser shadowing relationship values and determine a value of cooling power efficiency associated with each of the greater and lesser shadowing relationship values;
 then selecting a value of the shadowing relationship from the greater and lesser shadowing relationship values that corresponds to a greater cooling power efficiency between the greater and lesser shadowing relationship values; and
 then controlling the real time fan speed of the secondary cooling fan relative to the real time controlled fan speed of the primary cooling fan based on the selected greater or lesser shadowing relationship value that corresponds to a greater cooling power efficiency.

4. The method of claim 1, where the at least one heat-producing component is a central processing unit (CPU) that is assigned to a first cooling fan zone; where the primary cooling fan is assigned to the first cooling fan zone and mapped to cool the CPU within the first cooling fan zone; and where the secondary cooling fan is assigned to a secondary cooling fan zone that is located adjacent to the primary cooling fan zoned within the chassis enclosure.

5. The method of claim 1, where the chassis enclosure is a modular chassis enclosure containing multiple interchangeable modular heat-producing components disposed in an adjacent side-by-side relationship within the modular chassis enclosure; where the at least one heat-producing component is a given one of the interchangeable modular heat-producing components that is assigned to a primary cooling fan zone; where the primary cooling fan is assigned to the primary cooling fan zone and mapped to cool the modular heat-producing component within the primary cooling fan zone; and where the secondary cooling fan is assigned to a secondary cooling fan zone that is located adjacent to the primary cooling fan zone within the modular chassis enclosure.

6. The method of claim 5, where the method further comprises using a microcontroller to:
 receive a respective real time cooling fan speed request from each of the multiple interchangeable modular heat-producing components for the cooling fan assigned to its respective cooling fan zone;
 ignore any real time cooling fan request received from a modular heat-producing component within a secondary cooling fan zone;
 control a real time fan speed of the primary cooling fan based on the real time cooling fan speed request received from the modular heat-producing component within the primary cooling fan zone to cool the heat-producing component;
 control a real time fan speed of the secondary cooling fan relative to the real time controlled fan speed of the primary cooling fan based on a shadowing relationship;
 vary a value of the shadowing relationship so as to control the real time fan speed of the secondary cooling fan relative to the varied real time controlled fan speed and determine at least two values of cooling power efficiency associated with at least two respective different shadowing relationship values;
 then select a value of the shadowing relationship from the at least two different shadowing relationship values that corresponds to a greater cooling power efficiency between the two different shadowing relationship values; and
 then control the real time fan speed of the secondary cooling fan relative to the real time controlled fan speed of the primary cooling fan based on the selected shadowing relationship value that corresponds to a greater cooling power efficiency.

7. The method of claim 1, further comprising using:
 controlling the real time fan speed of the secondary cooling fan relative to the real time controlled fan speed of the primary cooling fan based on the selected shadowing relationship value that corresponds to a greater cooling power efficiency until detecting occurrence of an event that includes at least one of a change in system configuration, or change in power demand stress load, change in system environment; and
 upon detection of the occurrence of the event:
  (a) varying a value of the shadowing relationship so as to control the real time fan speed of the secondary cooling fan relative to the varied real time controlled fan speed and determine at least two values of cooling power efficiency associated with at least two respective different shadowing relationship values,
  (b) then again selecting a new value of the shadowing relationship from the at least two different shadowing relationship values that corresponds to a greater cooling power efficiency between the two different shadowing relationship values from step a), and
  (c) then controlling the real time fan speed of the secondary cooling fan relative to the real time controlled fan speed of the primary cooling fan based on the selected shadowing relationship value of step (b) that corresponds to a greater cooling power efficiency.

8. The method of claim 1, further comprising:
controlling a real time fan speed of the secondary cooling fan relative to the real time controlled fan speed of the primary cooling fan based on an initial shadowing relationship retrieved from non-volatile memory;
then varying a value of the shadowing relationship so as to control the real time fan speed of the secondary cooling fan relative to the varied real time controlled fan speed and-determining at least two values of cooling power efficiency associated with at least two respective different shadowing relationship values;
then selecting a value of the shadowing relationship from the at least two different shadowing relationship values that corresponds to a greater cooling power efficiency between the two different shadowing relationship values; and
then storing in non-volatile memory the selected shadowing relationship value that corresponds to a greater cooling power efficiency; and
then controlling the real time fan speed of the secondary cooling fan relative to the real time controlled fan speed of the primary cooling fan based on the stored selected shadowing relationship value that corresponds to a greater cooling power efficiency.

9. A method for controlling cooling fan response within a chassis enclosure of an information handling system, comprising:
operating at least one heat-producing component contained within the chassis enclosure, and using at least one temperature sensor to sense and provide a heat-producing component temperature signal representing the real time sensed temperature of the heat-producing component;
operating at least two separate variable speed cooling fans to provide different flow rates of cooling air within the chassis enclosure, at least one of the variable speed cooling fans being mapped as a primary cooling fan to cool the at least one heat-producing component and at least one of the variable speed cooling fans being a secondary cooling fan assigned to shadow the real time fan speed of the primary cooling fan; and
receiving the heat-producing component temperature signal from the temperature sensor, and controlling a real time fan speed of the primary cooling fan based on the heat-producing component temperature signal to cool the heat-producing component; and
further comprising:
controlling a real time fan speed of the secondary cooling fan relative to the real time controlled fan speed of the primary cooling fan based on a shadowing relationship,
varying a value of the shadowing relationship so as to control the real time fan speed of the secondary cooling fan relative to the varied real time controlled fan speed and determine at least two values of cooling power efficiency associated with at least two respective different shadowing relationship values,
then selecting a value of the shadowing relationship from the at least two different shadowing relationship values that corresponds to a greater cooling power efficiency between the two different shadowing relationship values, and
then controlling the real time fan speed of the secondary cooling fan relative to the real time controlled fan speed of the primary cooling fan based on the selected shadowing relationship value that corresponds to a greater cooling power efficiency; and
further comprising:
varying the shadowing relationship value at least one of an upward or downward direction so as to control the real time fan speed of the secondary cooling fan relative to the varied real time controlled fan speed using at least one of greater or lesser shadowing relationship values and determine a value of cooling power efficiency associated with each of the at least one greater or lesser shadowing relationship values,
then selecting a value of the shadowing relationship from the at least one of greater or lesser shadowing relationship values that corresponds to a greater cooling power efficiency between the at least one of greater or lesser shadowing relationship values, and
then controlling the real time fan speed of the secondary cooling fan relative to the real time controlled fan speed of the primary cooling fan based on the selected greater or lesser shadowing relationship value that corresponds to a greater cooling power efficiency; and
further comprising:
storing an initial shadowing relationship value on non-volatile memory, and
controlling at least two secondary cooling fans to shadow the real time fan speed of the primary cooling fan, where the primary cooling fan is assigned to a primary cooling fan zone defined within the chassis enclosure, the primary cooling fan zone including the heat-producing component, where each of the two secondary cooling fans is assigned to a respective secondary cooling fan zone that is different from the primary cooling fan zone and that is different from each other secondary cooling fan zone, and
further comprising:
simultaneously controlling a real time fan speed of each of the different secondary cooling fans relative to the real time controlled fan speed of the primary cooling fan based on the initial shadowing relationship,
then varying the shadowing relationship value in at least one of an upward or downward direction from the initial shadowing relationship value so as to simultaneously control the real time fan speed of each of the different secondary cooling fans relative to the varied real time controlled fan speed of the primary cooling fan zone using at least one greater shadowing relationship value or at least one lesser shadowing relationship value, and determining a value of cooling power efficiency associated with each of the at least one greater or lesser shadowing relationship values,
then determining if the at least one greater shadowing relationship value or at least one lesser shadowing relationship value corresponds to a greater cooling power efficiency than the initial shadowing relationship,
then at least one of selecting an upward direction for changing the shadowing relationship value if the greater shadowing relationship value corresponds to a greater cooling power efficiency than the initial shadowing relationship value, or then selecting a downward direction for changing the shadowing relationship value if the lesser shadowing relationship value corresponds to a greater cooling power efficiency than the initial shadowing relationship value, then iteratively varying the shadowing relationship value initial shadowing relationship value in the selected upward or downward direction multiple times by a selected incremental fixed value so as to simultaneously control the real time fan speed of each of the secondary cooling fans relative to the varied real time controlled fan speed of the primary cooling fan using each of the incrementally varied shadowing relationship values, and determining a value of cooling power efficiency associated with each of the incrementally varied shadowing relationship values, then selecting a value of the shadowing relationship from the incrementally varied shadowing relationship values that corresponds to a greater cooling power efficiency between the different incrementally varied shadowing relationship values, and then simultaneously controlling the real time fan speed of each the secondary cooling fan relative to the real time controlled fan speed of the primary cooling fan based on the selected incrementally varied shadowing relationship value that corresponds to a greater cooling power efficiency.

10. The method of claim 9, where the information handling system comprises non-volatile memory having an initial shadowing relationship value stored thereon, and at least two secondary cooling fans assigned to shadow the real time fan speed of the primary cooling fan; where the primary cooling fan is assigned to a primary cooling fan zone defined within the chassis enclosure, the primary cooling fan zone including the heat-producing component; where each of the two secondary cooling fans is assigned to a respective secondary cooling fan zone that is different from the primary cooling fan zone and that is different from each other secondary cooling fan zone; and where the method further comprises:

implementing direction decision level methodology to:
simultaneously control a real time fan speed of each of the different secondary cooling fans relative to the real time controlled fan speed of the primary cooling fan based on the initial shadowing relationship, then vary the shadowing relationship value in at least one of an upward or downward direction from the initial shadowing relationship value so as to simultaneously control the real time fan speed of each of the different secondary cooling fans relative to the varied real time controlled fan speed of the primary cooling fan zone using at least one greater shadowing relationship value or at least one lesser shadowing relationship value, and determine a value of cooling power efficiency associated with each of the at least one greater or lesser shadowing relationship values, then determine if the at least one greater shadowing relationship value or at least one lesser shadowing relationship value corresponds to a greater cooling power efficiency than the initial shadowing relationship, then at least one of select an upward direction for changing the shadowing relationship value if the greater shadowing relationship value corresponds to a greater cooling power efficiency than the initial shadowing relationship value, or then select a downward direction for changing the shadowing relationship value if the lesser shadowing relationship value corresponds to a greater cooling power efficiency than the initial shadowing relationship value;

then to implement uniform shadowing level methodology to:
iteratively vary the shadowing relationship value in the selected upward or downward direction multiple times from the initial shadowing relationship value by a selected incremental fixed value so as to simultaneously control the real time fan speed of each of the secondary cooling fans in a uniform manner relative to the varied real time controlled fan speed of the primary cooling fan using each of the incrementally varied uniform shadowing relationship values, and determine a value of cooling power efficiency associated with each of the incrementally varied uniform shadowing relationship values, and then select a value of the shadowing relationship from the incrementally varied uniform shadowing relationship values that corresponds to a greater cooling power efficiency between the different incrementally varied shadowing relationship values;

then to implement non-uniform shadowing level methodology to:
iteratively vary the shadowing relationship value separately for each of the secondary cooling fans in the selected upward or downward direction multiple times from the selected shadowing relationship value by a selected incremental fixed value in a non-uniform manner while holding the shadowing relationship value for each other of the secondary cooling fans equal to the selected shadowing relationship value so as to separately control the real time fan speed of only one of the secondary cooling fans at a time relative to the varied real time controlled fan speed of the primary cooling fan using each of the incrementally varied non-uniform shadowing relationship values, and determine a value of cooling power efficiency associated with each combination of the incrementally varied non-uniform shadowing relationship values and the non-varied shadowing relationship values for the each of the separate secondary cooling fans, and then select a combination of an incrementally varied non-uniform shadowing relationship value for one of the secondary cooling fans together with a non-varied shadowing relationship value for another of the secondary cooling fans that corresponds to a greater cooling power efficiency between all of the different combinations of incrementally varied non-uniform shadowing relationship value for one secondary cooling fan together with non-varied shadowing relationship value for another of the secondary cooling fans; and then to control the real time fan speed of the secondary cooling fans according to the selected combination of incrementally varied non-uniform shadowing relationship value for one of the secondary cooling fans together with a non-varied shadowing relationship value for another of the secondary cooling fans that corresponds to a greater cooling power efficiency.

11. An information handling system, comprising:
a chassis enclosure;
at least one heat-producing component contained within the chassis enclosure;

at least one temperature sensor configured to sense and provide a heat-producing component temperature signal representing the real time sensed temperature of the heat-producing component;

at least two separate variable speed cooling fans configured to provide different flow rates of cooling air within the chassis enclosure, at least one of the variable speed cooling fans being mapped as a primary cooling fan to cool the at least one heat-producing component and at least one of the variable speed cooling fans being a secondary cooling fan assigned to shadow the real time fan speed of the primary cooling fan; and at least one processing device that is a CPU, microcontroller, processor, microprocessor, FPGA, or ASIC coupled to receive the heat-producing component temperature signal from the temperature sensor, the processing device being programmed to control a real time fan speed of the primary cooling fan based on the heat-producing component temperature signal to cool the heat-producing component;

where the at least one processing device is further programmed to:

control a real time fan speed of the secondary cooling fan relative to the real time controlled fan speed of the primary cooling fan based on a shadowing relationship, vary a value of the shadowing relationship so as to control the real time fan speed of the secondary cooling fan relative to the varied real time controlled fan speed and determine at least two values of cooling power efficiency associated with at least two respective different shadowing relationship values, then select a value of the shadowing relationship from the at least two different shadowing relationship values that corresponds to a greater cooling power efficiency between the two different shadowing relationship values, and then control the real time fan speed of the secondary cooling fan relative to the real time controlled fan speed of the primary cooling fan based on the selected shadowing relationship value that corresponds to a greater cooling power efficiency;

where the at least one processing device is further programmed to:

vary the shadowing relationship in at least one of an upward or downward direction so as to control the real time fan speed of the secondary cooling fan relative to the varied real time controlled fan speed using at least one of greater or lesser shadowing relationship values and determine a value of cooling power efficiency associated with each of the at least one greater or lesser shadowing relationship values, then select a value of the shadowing relationship from the at least one of greater or lesser shadowing relationship values that corresponds to a greater cooling power efficiency between the at least one of greater or lesser shadowing relationship values, and then control the real time fan speed of the secondary cooling fan relative to the real time controlled fan speed of the primary cooling fan based on the selected greater or lesser shadowing relationship value that corresponds to a greater cooling power efficiency; and where the at least one processing device is further programmed to:

control a real time fan speed of the secondary cooling fan relative to the real time controlled fan speed of the primary cooling fan based on an initial shadowing relationship, then vary the shadowing relationship value in at least one of an upward or downward direction from the initial shadowing relationship value so as to control the real time fan speed of the secondary cooling fan relative to the varied real time controlled fan speed using at least one greater shadowing relationship value or at least one lesser shadowing relationship value, and determine a value of cooling power efficiency associated with each of the at least one greater shadowing relationship value or lesser shadowing relationship values, then determine if the at least one greater shadowing relationship value or at least one lesser shadowing relationship value corresponds to a greater cooling power efficiency than the initial shadowing relationship, then at least one of: select an upward direction for changing the shadowing relationship value if the greater shadowing relationship value corresponds to a greater cooling power efficiency than the initial shadowing relationship value, or select a downward direction for changing the shadowing relationship value if the lesser shadowing relationship value corresponds to a greater cooling power efficiency than the initial shadowing relationship value, then iteratively vary the shadowing relationship value in the selected upward or downward direction multiple times by a selected incremental fixed value so as to control the real time fan speed of the secondary cooling fan relative to the varied real time controlled fan speed of the primary cooling fan using each of the incrementally varied shadowing relationship values, and determine a value of cooling power efficiency associated with each of the incrementally varied shadowing relationship values, then select a value of the shadowing relationship from the incrementally varied shadowing relationship values that corresponds to a greater cooling power efficiency between the different incrementally varied shadowing relationship values, and then control the real time fan speed of the secondary cooling fan relative to the real time controlled fan speed of the primary cooling fan based on the selected incrementally varied shadowing relationship value that corresponds to a greater cooling power efficiency.

12. The system of claim 11, where the at least one CPU, microcontroller, processor, microprocessor, FPGA, or ASIC is further programmed to perform the following during operation of the information handling system upon the occurrence of at least one of system power-on and system booting of the information handling system, detection of a change to a different system configuration, detection of a change in computational and/or power demand stress loads, detection of change in system environment outside the chassis, and/or detection of a change in one or more of system steady state conditions of operating power load, fan speed or operating temperature operation from a previously established steady state conditions:

control a real time fan speed of the secondary cooling fan relative to the real time controlled fan speed of the primary cooling fan based on a shadowing relationship,
vary a value of the shadowing relationship so as to control the real time fan speed of the secondary cooling fan relative to the varied real time controlled fan speed and determine at least two values of cooling power efficiency associated with at least two respective different shadowing relationship values,
then select a value of the shadowing relationship from the at least two different shadowing relationship values that corresponds to a greater cooling power efficiency between the two different shadowing relationship values, and
then control the real time fan speed of the secondary cooling fan relative to the real time controlled fan speed of the primary cooling fan based on the selected shadowing relationship value that corresponds to a greater cooling power efficiency.

13. The system of claim 11, where the at least one CPU, microcontroller, processor, microprocessor, FPGA, or ASIC is further programmed to:
vary the shadowing relationship value both upward and downward so as to control the real time fan speed of the secondary cooling fan relative to the varied real time controlled fan speed using each of a greater and lesser shadowing relationship values and determine a value of cooling power efficiency associated with each of the greater and lesser shadowing relationship values;
then select a value of the shadowing relationship from the greater and lesser shadowing relationship values that corresponds to a greater cooling power efficiency between the greater and lesser shadowing relationship values; and
then control the real time fan speed of the secondary cooling fan relative to the real time controlled fan speed of the primary cooling fan based on the selected greater or lesser shadowing relationship value that corresponds to a greater cooling power efficiency.

14. The system of claim 11, where the at least one heat-producing component is a central processing unit (CPU) that is assigned to a first cooling fan zone; where the primary cooling fan is assigned to the first cooling fan zone and mapped to cool the CPU within the first cooling fan zone; and where the secondary cooling fan is assigned to a secondary cooling fan zone that is located adjacent to the primary cooling fan zoned within the chassis enclosure.

15. The system of claim 11, where the chassis enclosure is a modular chassis enclosure containing multiple interchangeable modular heat-producing components disposed in an adjacent side-by-side relationship within the modular chassis enclosure; where the at least one heat-producing component is a given one of the interchangeable modular heat-producing components that is assigned to a primary cooling fan zone; where the primary cooling fan is assigned to the primary cooling fan zone and mapped to cool the modular heat-producing component within the primary cooling fan zone; and where the secondary cooling fan is assigned to a secondary cooling fan zone that is located adjacent to the primary cooling fan zone within the modular chassis enclosure.

16. The system of claim 8, where the at least one CPU, microcontroller, processor, microprocessor, FPGA, or ASIC is a first microcontroller coupled and programmed to control the primary cooling fan based on a received cooling fan request; where each of the multiple interchangeable modular heat-producing components includes at least one second CPU, microcontroller, processor, microprocessor, FPGA, or ASIC coupled to monitor a temperature of its respective heat-producing component and based on the monitored temperature to provide a respective real time cooling fan speed request to the first microcontroller for the cooling fan assigned to its respective cooling fan zone; where the first microcontroller is programmed to ignore any real time cooling fan request received from a second CPU, microcontroller, processor, microprocessor, FPGA, or ASIC of a modular heat-producing component within a secondary cooling fan zone; and where the first microcontroller is programmed to:
receive a real time cooling fan speed request for the primary cooling fan from a second CPU, microcontroller, processor, microprocessor, FPGA, or ASIC of a modular heat-producing component within the primary cooling fan zone;
control a real time fan speed of the primary cooling fan based on the real time cooling fan speed request received from the second CPU, microcontroller, processor, microprocessor, FPGA, or ASIC of the modular heat-producing component within the primary cooling fan zone to cool the heat-producing component;
control a real time fan speed of the secondary cooling fan relative to the real time controlled fan speed of the primary cooling fan based on a shadowing relationship;
vary a value of the shadowing relationship so as to control the real time fan speed of the secondary cooling fan relative to the varied real time controlled fan speed and determine at least two values of cooling power efficiency associated with at least two respective different shadowing relationship values;
then select a value of the shadowing relationship from the at least two different shadowing relationship values that corresponds to a greater cooling power efficiency between the two different shadowing relationship values; and
then control the real time fan speed of the secondary cooling fan relative to the real time controlled fan speed of the primary cooling fan based on the selected shadowing relationship value that corresponds to a greater cooling power efficiency.

17. The system of claim 11, where the at least one CPU, microcontroller, processor, microprocessor, FPGA, or ASIC is further programmed to:
control the real time fan speed of the secondary cooling fan relative to the real time controlled fan speed of the primary cooling fan based on the selected shadowing relationship value that corresponds to a greater cooling power efficiency until the CPU, microcontroller, processor, microprocessor, FPGA, or ASIC detects occurrence of an event that includes at least one of a change in system configuration, or change in power demand stress load, change in system environment; and
upon detection of the occurrence of the event to:
(a) vary a value of the shadowing relationship so as to control the real time fan speed of the secondary cooling fan relative to the varied real time controlled fan speed and determine at least two values of cooling power efficiency associated with at least two respective different shadowing relationship values,
(b) then again select a new value of the shadowing relationship from the at least two different shadowing relationship values that corresponds to a greater cooling power efficiency between the two different shadowing relationship values from step a), and (c) then control the real time fan speed of the secondary cooling fan relative to the real time controlled fan speed of the primary cooling fan based on the selected shadowing relationship value of step (b) that corresponds to a greater cooling power efficiency.

18. The system of claim 11, further comprising non-volatile memory coupled to the at least one CPU, microcontroller, processor, microprocessor, FPGA, or ASIC; where the at least one CPU, microcontroller, processor, microprocessor, FPGA, or ASIC is further programmed to:
control a real time fan speed of the secondary cooling fan relative to the real time controlled fan speed of the primary cooling fan based on an initial shadowing relationship retrieved from the non-volatile memory;
then vary a value of the shadowing relationship so as to control the real time fan speed of the secondary cooling fan relative to the varied real time controlled fan speed and determine at least two values of cooling power efficiency associated with at least two respective different shadowing relationship values;
then select a value of the shadowing relationship from the at least two different shadowing relationship values that corresponds to a greater cooling power efficiency between the two different shadowing relationship values; and
then store in the non-volatile memory the selected shadowing relationship value that corresponds to a greater cooling power efficiency; and
then control the real time fan speed of the secondary cooling fan relative to the real time controlled fan speed of the primary cooling fan based on the stored selected shadowing relationship value that corresponds to a greater cooling power efficiency.

19. An information handling system, comprising:
a chassis enclosure;
at least one heat-producing component contained within the chassis enclosure;
at least one temperature sensor configured to sense and provide a heat-producing component temperature signal representing the real time sensed temperature of the heat-producing component;
at least two separate variable speed cooling fans configured to provide different flow rates of cooling air within the chassis enclosure, at least one of the variable speed cooling fans being mapped as a primary cooling fan to cool the at least one heat-producing component and at least one of the variable speed cooling fans being a secondary cooling fan assigned to shadow the real time fan speed of the primary cooling fan; and
at least one processing device that is a CPU, microcontroller, processor, microprocessor, FPGA, or ASIC coupled to receive the heat-producing component temperature signal from the temperature sensor, the processing device being programmed to control a real time fan speed of the primary cooling fan based on the heat-producing component temperature signal to cool the heat-producing component;
where the at least one processing device is further programmed to:
control a real time fan speed of the secondary cooling fan relative to the real time controlled fan speed of the primary cooling fan based on a shadowing relationship,
vary a value of the shadowing relationship so as to control the real time fan speed of the secondary cooling fan relative to the varied real time controlled fan speed and determine at least two values of cooling power efficiency associated with at least two respective different shadowing relationship values,
then select a value of the shadowing relationship from the at least two different shadowing relationship values that corresponds to a greater cooling power efficiency between the two different shadowing relationship values, and
then control the real time fan speed of the secondary cooling fan relative to the real time controlled fan speed of the primary cooling fan based on the selected shadowing relationship value that corresponds to a greater cooling power efficiency;
where the at least one processing device is further programmed to:
vary the shadowing relationship in at least one of an upward or downward direction so as to control the real time fan speed of the secondary cooling fan relative to the varied real time controlled fan speed using at least one of greater or lesser shadowing relationship values and determine a value of cooling power efficiency associated with each of the at least one greater or lesser shadowing relationship values,
then select a value of the shadowing relationship from the at least one of greater or lesser shadowing relationship values that corresponds to a greater cooling power efficiency between the at least one of greater or lesser shadowing relationship values, and
then control the real time fan speed of the secondary cooling fan relative to the real time controlled fan speed of the primary cooling fan based on the selected greater or lesser shadowing relationship value that corresponds to a greater cooling power efficiency; and
where the system further comprises:
non-volatile memory coupled to the at least one processing device, the non-volatile memory having an initial shadowing relationship value stored thereon, and
at least two secondary cooling fans assigned to shadow the real time fan speed of the primary cooling fan; where the primary cooling fan is assigned to a primary cooling fan zone defined within the chassis enclosure, the primary cooling fan zone including the heat-producing component,
where each of the two secondary cooling fans is assigned to a respective secondary cooling fan zone that is different from the primary cooling fan zone and that is different from each other secondary cooling fan zone, and
where the at least one CPU, microcontroller, processor, microprocessor, FPGA, or ASIC is further programmed to implement uniform shadowing methodology to:
simultaneously control a real time fan speed of each of the different secondary cooling fans relative to the real time controlled fan speed of the primary cooling fan based on the initial shadowing relationship,
then vary the shadowing relationship value in at least one of an upward or downward direction from the initial shadowing relationship value so as to simultaneously control the real time fan speed of each of the different secondary cooling fans relative to the varied real time controlled fan speed of the primary cooling fan zone using at least one greater shadowing relationship value or at least one lesser shadowing relationship value, and determine a value of cooling power efficiency associated with each of the at least one greater or lesser shadowing relationship values, then determine if the at least one greater shadowing relationship value or at least one lesser shadowing relationship value corresponds to a greater cooling power efficiency than the initial shadowing relationship, then at least one of select an upward direction for changing the shadowing relationship value if the greater shadowing relationship value corresponds to a greater cooling power efficiency than the initial shadowing relationship value, or then select a downward direction for changing the shadowing relationship value if the lesser shadowing relationship value corresponds to a greater cooling power efficiency than the initial shadowing relationship value, then iteratively vary the shadowing relationship value initial shadowing relationship value in the selected upward or downward direction multiple times by a selected incremental fixed value so as to simultaneously control the real time fan speed of each of the secondary cooling fans relative to the varied real time controlled fan speed of the primary cooling fan using each of the incrementally varied shadowing relationship values, and determine a value of cooling power efficiency associated with each of the incrementally varied shadowing relationship values, then select a value of the shadowing relationship from the incrementally varied shadowing relationship values that corresponds to a greater cooling power efficiency between the different incrementally varied shadowing relationship values, and then simultaneously control the real time fan speed of each the secondary cooling fan relative to the real time controlled fan speed of the primary cooling fan based on the selected incrementally varied shadowing relationship value that corresponds to a greater cooling power efficiency.

20. The system of claim 19, further comprising:

non-volatile memory coupled to the at least one processing device, the non-volatile memory having an initial shadowing relationship value stored thereon; and at least two secondary cooling fans assigned to shadow the real time fan speed of the primary cooling fan;

where the primary cooling fan is assigned to a primary cooling fan zone defined within the chassis enclosure, the primary cooling fan zone including the heat-producing component;

where each of the two secondary cooling fans is assigned to a respective secondary cooling fan zone that is different from the primary cooling fan zone and that is different from each other secondary cooling fan zone; and where the at least one CPU, microcontroller, processor, microprocessor, FPGA, or ASIC is further programmed to implement direction decision level methodology to:

simultaneously control a real time fan speed of each of the different secondary cooling fans relative to the real time controlled fan speed of the primary cooling fan based on the initial shadowing relationship, then vary the shadowing relationship value in at least one of an upward or downward direction from the initial shadowing relationship value so as to simultaneously control the real time fan speed of each of the different secondary cooling fans relative to the varied real time controlled fan speed of the primary cooling fan zone using at least one greater shadowing relationship value or at least one lesser shadowing relationship value, and determine a value of cooling power efficiency associated with each of the at least one greater or lesser shadowing relationship values, then determine if the at least one greater shadowing relationship value or at least one lesser shadowing relationship value corresponds to a greater cooling power efficiency than the initial shadowing relationship, then at least one of select an upward direction for changing the shadowing relationship value if the greater shadowing relationship value corresponds to a greater cooling power efficiency than the initial shadowing relationship value, or then select a downward direction for changing the shadowing relationship value if the lesser shadowing relationship value corresponds to a greater cooling power efficiency than the initial shadowing relationship value;

where the at least one CPU, microcontroller, processor, microprocessor, FPGA, or ASIC is further programmed to then implement uniform shadowing level methodology to:

iteratively vary the shadowing relationship value in the selected upward or downward direction multiple times from the initial shadowing relationship value by a selected incremental fixed value so as to simultaneously control the real time fan speed of each of the secondary cooling fans in a uniform manner relative to the varied real time controlled fan speed of the primary cooling fan using each of the incrementally varied uniform shadowing relationship values, and determine a value of cooling power efficiency associated with each of the incrementally varied uniform shadowing relationship values, and then select a value of the shadowing relationship from the incrementally varied uniform shadowing relationship values that corresponds to a greater cooling power efficiency between the different incrementally varied shadowing relationship values;

where the at least one CPU, microcontroller, processor, microprocessor, FPGA, or ASIC is further programmed to then implement non-uniform shadowing level methodology to:

iteratively vary the shadowing relationship value separately for each of the secondary cooling fans in the selected upward or downward direction multiple times from the selected shadowing relationship value by a selected incremental fixed value in a non-uniform manner while holding the shadowing relationship value for each other of the secondary cooling fans equal to the selected shadowing relationship value so as to separately control the real time fan speed of only one of the secondary cooling fans at a time relative to the varied real time controlled fan speed of the primary cooling fan using each of the incrementally varied non-uniform shadowing relationship values, and determine a value of cooling power efficiency associated with each combination of the incrementally varied non-uniform shadowing relationship values and the non-varied shadowing relationship values for the each of the separate secondary cooling fans, and then select a combination of an incrementally varied non-uniform shadowing relationship value for one of the secondary cooling fans together with a non-varied shadowing relationship value for another of the secondary cooling fans that corresponds to a greater cooling power efficiency between all of the different combinations of incrementally varied non-uniform shadowing relationship value for one secondary cooling fan together with non-varied shadowing relationship value for another of the secondary cooling fans; and where the at least one CPU, microcontroller, processor, microprocessor, FPGA, or ASIC is further programmed to then control the real time fan speed of the secondary cooling fans according to the selected combination of incrementally varied non-uniform shadowing relationship value for one of the secondary cooling fans together with a non-varied shadowing relationship value for another of the secondary cooling fans that corresponds to a greater cooling power efficiency.

* * * * *